US012566370B2

(12) United States Patent　　　　(10) Patent No.:　US 12,566,370 B2

Bauer　　　　　　　　　　　　　　　(45) Date of Patent:　　Mar. 3, 2026

(54) METHOD AND APPARATUS FOR REPAIRING A DEFECT OF A LITHOGRAPHIC MASK

(71) Applicant: Carl Zeiss SMT GmbH, Oberkochen (DE)

(72) Inventor: Markus Bauer, Schneckenlohe (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 541 days.

(21) Appl. No.: 18/096,726

(22) Filed: Jan. 13, 2023

(65) Prior Publication Data

US 2023/0152685 A1　　May 18, 2023

Related U.S. Application Data

(63) Continuation of application No. PCT/EP2021/069641, filed on Jul. 14, 2021.

(30) Foreign Application Priority Data

Jul. 17, 2020　(DE) ......................... 102020208980.9

(51) Int. Cl.
　　*G03F 1/74*　　　　　(2012.01)
　　*G03F 1/84*　　　　　(2012.01)
(52) U.S. Cl.
　　CPC . *G03F 1/74* (2013.01); *G03F 1/84* (2013.01)
(58) Field of Classification Search
　　CPC ......................................................... G03F 1/84
　　See application file for complete search history.

(56) References Cited

U.S. PATENT DOCUMENTS

| | | | |
|---|---|---|---|
| 6,340,543 B1 | 1/2002 | Nagamura et al. | |
| 8,498,469 B2 | 7/2013 | Xiao et al. | |
| 8,739,080 B1 | 5/2014 | Tsai et al. | |
| 10,318,697 B2 | 6/2019 | Rieger et al. | |
| 2003/0186130 A1* | 10/2003 | Nakayama ................ | G03F 1/72 |
| | | | 430/323 |
| 2004/0151991 A1 | 8/2004 | Stewart et al. | |
| 2004/0151992 A1 | 8/2004 | Nagamura et al. | |
| 2006/0046160 A1 | 3/2006 | Wallace et al. | |
| 2008/0077907 A1 | 3/2008 | Kulkami | |

(Continued)

FOREIGN PATENT DOCUMENTS

| | | |
|---|---|---|
| CN | 1225678 C | 11/2005 |
| DE | 10030143 | 5/2001 |

(Continued)

OTHER PUBLICATIONS

The Office Action issued by the Japanese Patent Office for Application No. JP 2023-503183 by Examiner Hidenao Tanaka, dated Nov. 20, 2023 (with English Translation).

(Continued)

*Primary Examiner* — Chanceity N Robinson

(74) *Attorney, Agent, or Firm* — Fish & Richardson P.C.

(57)　　　　　ABSTRACT

A method for repairing at least one defect of a lithographic mask comprises the step of: ascertaining parameters of at least one repair shape for the at least one defect, wherein ascertaining parameters comprises: allocating at least one numerical value to a parameter, wherein the numerical value deviates from the numerical value predefined by the at least one defect for said parameter.

28 Claims, 22 Drawing Sheets

(56) References Cited

U.S. PATENT DOCUMENTS

| 2009/0202925 | A1 | 8/2009 | Suda |
| 2009/0258302 | A1 | 10/2009 | Ho et al. |
| 2014/0065521 | A1 | 3/2014 | Lu et al. |
| 2014/0165236 | A1 | 6/2014 | Budach et al. |
| 2018/0284600 | A1 | 10/2018 | Steigerwald et al. |
| 2019/0391482 | A1 | 12/2019 | Oster et al. |
| 2021/0132594 | A1 | 5/2021 | Budach et al. |

FOREIGN PATENT DOCUMENTS

| DE | 102004004854 | | 9/2004 |
| DE | 102017203841 | | 9/2018 |
| DE | 102017205629 | | 10/2018 |
| DE | 102018209562 | | 12/2019 |
| JP | 4-165353 | | 6/1992 |
| JP | 6-95365 | | 4/1994 |
| JP | 09080741 | A * | 3/1997 |
| JP | H09-80741 | | 3/1997 |
| JP | 2002-107913 | | 4/2002 |
| JP | 2003-140321 | | 5/2003 |
| JP | 2004-157324 | | 6/2004 |
| JP | 2004157324 | A * | 6/2004 |
| JP | 2014-521230 | | 8/2014 |
| JP | 2018-124466 | | 8/2018 |
| KR | 1020050054948 | | 6/2005 |
| TW | 201800836 | | 1/2018 |
| TW | 201910910 | | 3/2019 |
| WO | WO 2019/219826 | | 11/2019 |

OTHER PUBLICATIONS

The Office Action issued by the Korean Patent Office for Application No. KR 10-2023-7005238 dated Mar. 5, 2025 (English Translation Only).

The Office Action issued by the German Patent Office for Application No. DE 10 2020 208 980.9, dated Mar. 9, 2021 (With English Machine Translation).

The International Search Report for International Application No. PCT/EP2021/069641, dated Nov. 4, 2021.

The Office Action issued by the German Patent Office for Application No. DE 10 2020 208 980.9, dated Mar. 9, 2021.

The Office Action and Search Report issued by the Taiwan Patent Office for Application No. TW 110125813, dated Feb. 21, 2022 (With English Translation).

Gan et al., "Placement of Sub-Resolution Assist Features Based on a Genetic Algorithm", *IEEE Access* (2017).

Gupta et al., "Manufacturing-aware design methodology for assist feature correctness", Design and Process Integration for Microelectronic Manufacturing, III, *Proceedings of SPIE*, vol. 5756, pp. 131-140 (2005).

The Office Action issued by the Japanese Patent Office for Application No. JP 2024-113098, dated Jun. 2, 2025 (English Translation Only).

* cited by examiner

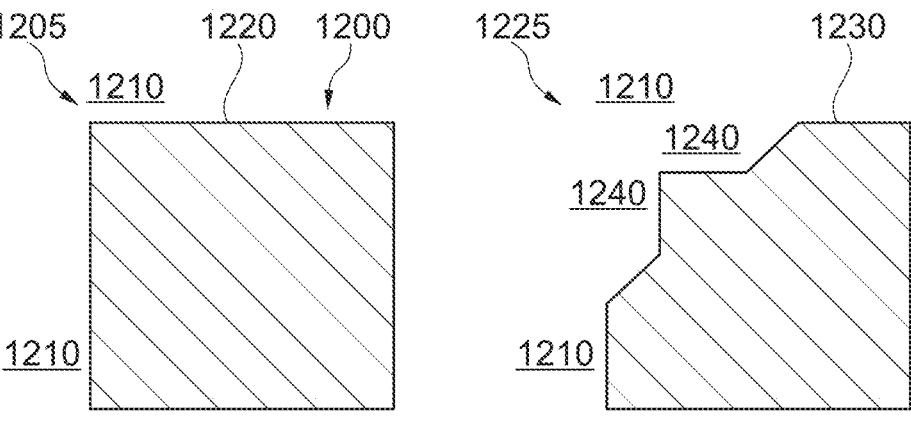
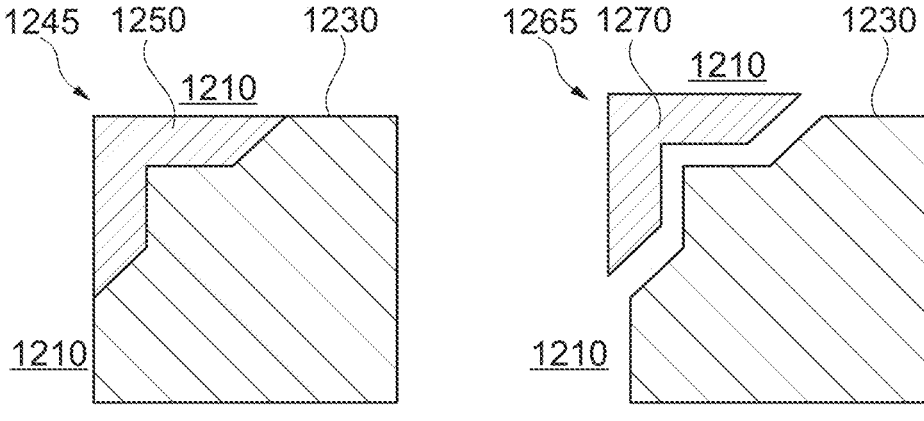
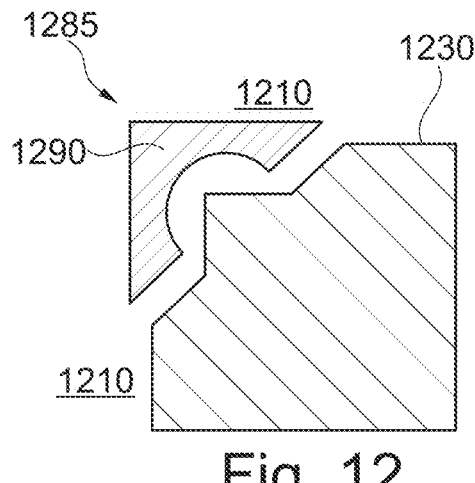
Fig. 12

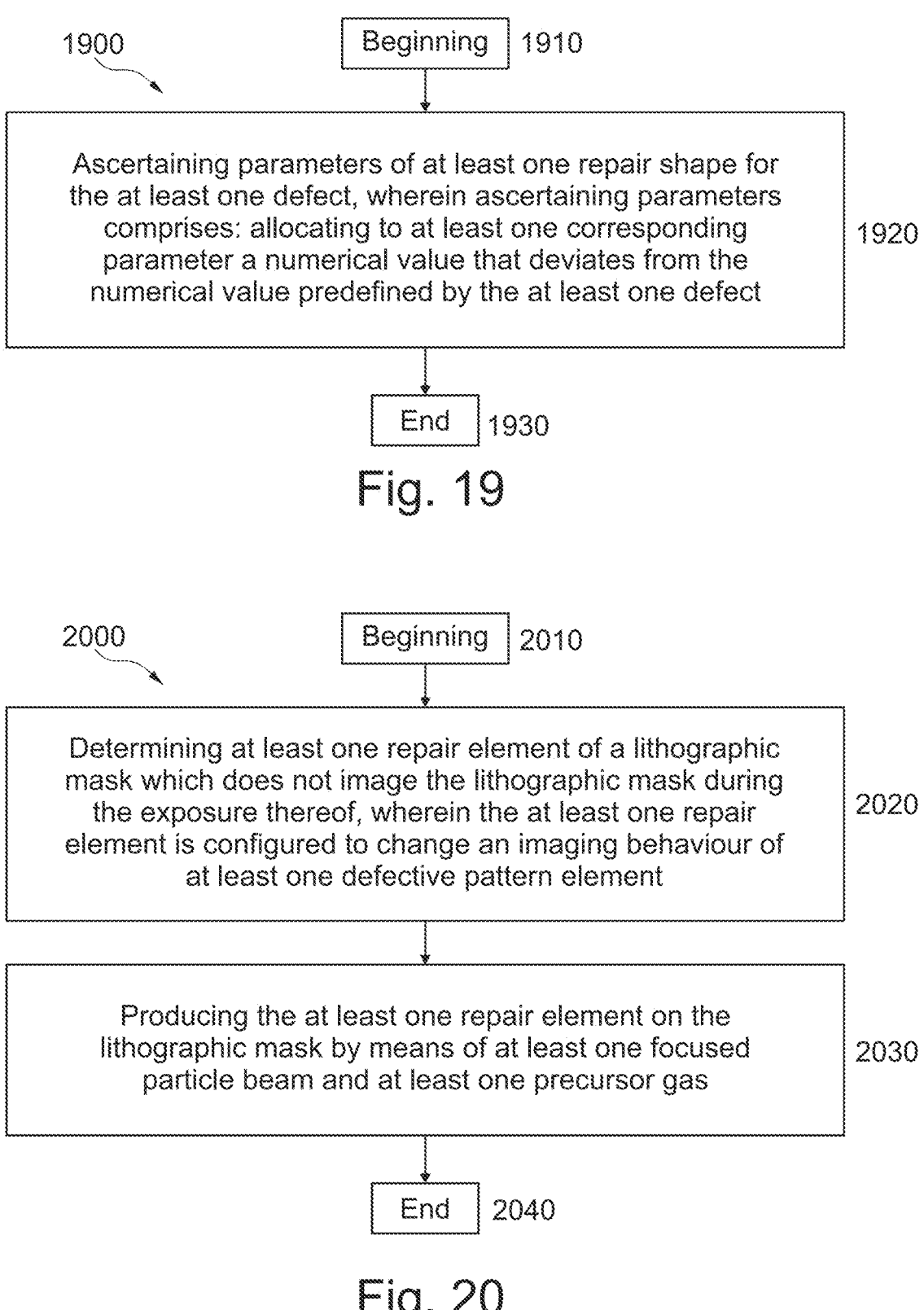

1900

Beginning  1910

Ascertaining parameters of at least one repair shape for the at least one defect, wherein ascertaining parameters comprises: allocating to at least one corresponding parameter a numerical value that deviates from the numerical value predefined by the at least one defect    1920

End  1930

Beginning  2010

Determining at least one repair element of a lithographic mask which does not image the lithographic mask during the exposure thereof, wherein the at least one repair element is configured to change an imaging behaviour of at least one defective pattern element    2020

Producing the at least one repair element on the lithographic mask by means of at least one focused particle beam and at least one precursor gas    2030

End  2040

Fig. 20

METHOD AND APPARATUS FOR REPAIRING A DEFECT OF A LITHOGRAPHIC MASK

CROSS-REFERENCE TO RELATED APPLICATIONS

This application is a continuation of and claims priority under 35 U.S.C. § 120 from PCT Application No. PCT/EP2021/069641, filed on Jul. 14, 2021, which claims priority from German patent application DE 10 2020 208 980.9, filed on Jul. 17, 2020, and entitled "Verfahren and Vorrichtung zum Reparieren eines Defekts einer lithographischen Maske." The entire contents of each of the above priority applications are incorporated herein by reference.

TECHNICAL FIELD

The present invention relates to a method and an apparatus for repairing at least one defect of a lithographic mask. Furthermore, the present invention relates to a method and an apparatus for repairing at least one pattern element of a lithographic mask.

BACKGROUND

As a consequence of the growing integration density in the semiconductor industry, lithographic masks have to image increasingly smaller structures on wafers. One possibility for taking account of this trend is to use lithographic or photolithographic masks whose actinic wavelength is shifted to ever shorter wavelengths. Currently, ArF (argon fluoride) excimer lasers that emit at a wavelength of approximately 193 nm are frequently used as light sources in photolithography. The use of masks for double or multiple exposures makes it possible to produce in a photoresist structures having dimensional sizes that cannot be achieved with a single exposure step.

Photolithography systems are presently being developed that use electromagnetic radiation in the EUV (extreme ultraviolet) wavelength range (preferably in the range of 10 nm to 15 nm). These EUV photolithography systems are based on a completely new beam guiding concept which uses reflective optical elements, since no materials are currently available that are optically transparent in the stated EUV range. The technological challenges in developing EUV systems are enormous, and tremendous development efforts are necessary to bring said systems to a level where they are ready for industrial application.

A crucial contribution to the imaging of ever smaller structures in the photoresist arranged on a wafer is accorded to lithographic masks, photolithographic masks, exposure masks, photomasks or just masks. With every further increase in integration density, it becomes increasingly more important to reduce the minimum structure size that exposure masks can image. In order that the structures of a mask that are becoming smaller can be reliably imaged in a photoresist applied to a wafer, resolution enhancement techniques (RETs) such as, for instance, optical proximity correction (OPC) techniques are being used to an increasing extent. The following exemplary documents describe various aspects of RET or OPC techniques: W.-M. Gan et al.: "Placement of sub-resolution assist features based on a generic algorithm", DOI 10.1109/ACCESS.2019.2926102, IEEE ACCESS, P. Gupta et al.: "Manufacturing-aware design methodology for assist feature correctness", Design and Process Integration for Microelectronic Manufacturing III, Proc. of SPIE Vol. 4756, Bellingham, WA, 2005, doi: 10.1117/12.604872, US 2006/0046160 A1, U.S. Pat. No. 8,739,080 B1, U.S. Pat. No. 8,498,469 B2, US 2008/0077907 A1, US 2009/0258302 A1 and U.S. Pat. No. 10,318,697 B2.

Owing to the combination of structure elements or pattern elements that are becoming smaller and the use of RET techniques, the process for producing photolithographic masks is becoming increasingly more complex and thus more time-consuming and ultimately also more expensive.

On account of the tiny structure sizes of the pattern elements, ever smaller deviations of the pattern elements produced on a wafer from the design specifications during mask production are manifested in visible or "printable" errors. These must be repaired—whenever possible. Owing to the small dimensional sizes of the defects visible on a wafer, which attain values in the low double-digit nanometers range, for example, the outlay required to detect said defects is becoming very high. Furthermore, the repair of increasingly smaller defects is becoming more and more difficult. Firstly, the positioning of a repair tool relative to an identified defect is possible only with very complex metrology and, secondly, setting the repair tool to a specific small defect requires a high expenditure of time.

The present invention therefore addresses the problem of specifying methods and apparatuses that improve the repair of, in particular, small defects of lithographic masks.

SUMMARY

In accordance with one exemplary embodiment of the present invention, this problem is solved by use of a method according to claim 1 and an apparatus according to claim 22. In a further exemplary embodiment, this problem is solved by use of a method according to claim 18 and an apparatus according to claim 23.

In one embodiment, the method for repairing at least one defect of a lithographic mask comprises the step of: ascertaining parameters of at least one repair shape for the at least one defect, wherein ascertaining parameters comprises: allocating at least one numerical value to a parameter, wherein the numerical value deviates from the numerical value predefined by the at least one defect for said parameter. In particular, this may be advantageous for small defects, i.e. defects having at least one dimensional size which is smaller than ten times the resolution limit of the mask, smaller than five times the resolution limit, smaller than three times the resolution limit, or smaller than the resolution limit. It may be particularly advantageous if small defects have at least one-dimensional size within a range of 2% to 50% of the resolution limit.

A defect to be repaired typically defines the parameters of the repair shape which are used for repairing the defect. Through comprehensive analyses the inventor has discovered that the compensation or repair of, in particular, very small defects that hitherto had been able to be eliminated only with extreme difficulty can be significantly simplified if at least one of the parameters of the repair shape is allocated a different numerical value from what is actually required by the repair of the defect. In particular, this may be advantageous for small defects, i.e. defects having at least one-dimensional size which is within a range of 2% to 50% of the resolution limit of the mask.

A repair shape, whose parameters exclusively have numerical values which were ascertained on the basis of measured values is also referred to hereinafter as nominal repair shape. A nominal repair shape is typically formed from the difference between a measured mask segment having a defect and a measured equivalent defect-free mask segment. Alternatively and/or additionally, it is also possible to produce a nominal repair shape by the design data of a measured, defective mask segment being subtracted from the latter. A repair shape used in a method according to the invention differs from a nominal repair shape in that in the first-mentioned repair shape at least one parameter has a numerical value which deviates from the numerical value ascertained from measurement results.

Put simply, it may be advantageous to effect a repair (e.g. of an edge error) not exclusively on the basis of parameters whose numerical values are predefined by the respective defect (e.g. in the case of an edge error by the difference between the erroneous edge position and the target edge position predefined by the mask design). This is because, particularly if the numerical value of a parameter is in the region of the resolution limit or even below that (e.g. the edge position is only very slightly erroneous), a very precise repair is necessary in order to correct this (small) defect. Small errors during the repair may have the effect here that the repair does not entail a significant improvement. However, if a targeted departure is made from a numerical value predefined by the respective defect for the corresponding parameter, what can be achieved is that errors during the repair have a significantly less pronounced effect, however, and so the requirements made of the repair process can be relaxed, if appropriate.

The method according to the invention is explained below on the basis of the example of an edge placement error of a pattern element. A deviation dx of an edge of a pattern element from the specifications of the mask design is transformed by the mask, during an exposure process, into an edge placement error EPE, given by the product of the deviation dx, a possible mask enhancement factor MEEF (Mask Error Enhancement Factor) for the defect or the deviation and the magnification or reduction of the projection lens disposed downstream of the mask. A projection lens of a photolithographic exposure system often has a magnification $M=\frac{1}{4}$ or $M=\frac{1}{5}$.

However, if the deviation dx of an edge of a pattern element becomes smaller than the resolution limit of the photolithographic mask, the latter translates the deviation dx to a greatly reduced extent during an exposure process into a reduced edge placement error. This is caused by the actinic radiation of a photomask being averaged over structures whose dimensional sizes are smaller than the resolution capability of the mask. The details of this averaging process depend on the structures considered and the details of the exposure process used for imaging these structure elements. The present application makes use of this substantive matter in order to facilitate the repair of defects whose dimensional sizes are below the resolution limit of the lithographic mask.

In this regard, during an edge repair of a pattern element, for example, the parameters of which repair (or the parameters of the corresponding nominal repair shape) actually (predefined numerically by the defect) require deposition of material from the measured edge as far as the target edge, material can deliberately be deposited at a distance from the measured edge, wherein the material is optionally deposited over a smaller length. An error in the exact positioning of the deposited material can thus (e.g. on account of diffraction effects) have a significantly lesser effect on the quality of the repaired mask. This analogously also applies to the case of an error that requires etching of material, in which in the case of an edge error, for example, material can be etched at a distance from the measured edge.

A repair shape combines the sum of the instructions that are carried out by a repair tool in order to eliminate a defect of a photomask. For the example of a defect of excess material, the repair shape describes a local etching process that can be used to remove the excess material from the mask. A repair shape typically has a basic area scanned by a particle beam in the manner defined in the repair shape. This means that the repair shape defines the energy of the particles of the particle beam, the spot width at the focus of the particle beam, the residence duration thereof on a location, the distance between adjacent points of incidence of the particle beam on the mask or the defect, and the time period until the particle beam reaches the starting point again. The area scanned by the particle beam and also the numerical values of the parameters indicated above may change in the course of implementing the repair shape. In the case of a local etching process, the repair shape furthermore specifies the temporal progression of the provision of the etching gas(es), i.e. the repair shape controls the gas volumetric flow of the etching gas(es) during the processing of the at least one defect.

In this application, the term lithographic mask encompasses a photolithographic mask.

The at least one parameter can comprise at least one element from the group: at least one lateral dimensional size of the at least one repair shape, a height dimensional size of the at least one repair shape, a distance between the at least one repair shape and the at least one defect, a material composition of the at least one defect, a geometric shape of the at least one repair shape, and surroundings of the at least one defect on the lithographic mask. The material composition of the at least one defect predominantly determines the complex refractive index thereof.

The facilitation or improvement of the repair or compensation of small defects can be brought about by various measures. In one respect, the defect need not be repaired 1:1, as predefined by the parameters of a nominal repair shape. In this regard, the basic area of the repair shape can be smaller than the basic area of the defect. In another respect, the height of the repair shape can be smaller than the height of the defect. The method defined above thus enables a defect correction in which a material removal from the mask or a material build-up on the mask can be smaller than the volume of the defect. This circumstance has a favorable effect on the defect processing time.

In another aspect, the above-explained averaging of the actinic radiation over structures that are smaller than the resolution capability enables the repair shape to be placed somewhat away from the position of the original defect. As a result, the very stringent requirements made of the positional accuracy during the placement of the repair shape for a defect are distinctly relaxed, without the quality of the defect repair or defect compensation being significantly disadvantageously influenced.

Furthermore, the geometric shape of the repair shape can deviate from the actual defect shape. This allows the defect repair to be distinctly simplified since the shape of the repair shape can be chosen at least partly independently of the defect shape and thus with a geometric shape that can be produced significantly more simply.

The at least one parameter can deviate by a predetermined absolute value from the numerical value predefined by the at least one defect for said parameter.

The deviation of the numerical value of the at least one lateral parameter can be selected from a range whose lower limit is greater than zero and whose upper limit is less than a resolution limit (of a defect-free region) of the lithographic mask.

The resolution limit of a lithographic mask can be determined by an actinic wavelength of the lithographic mask, a numerical aperture (NA), and an exposure setting suitable for projecting a pattern of the lithographic mask into a photoresist arranged on a wafer.

The numerical aperture can comprise the NA of a projection lens of an exposure system suitable for projecting the pattern of the lithographic mask into the photoresist. The NA of the projection lens can comprise a mask-side numerical aperture ($NA_M$).

Typically, a lithographic mask is designed for operation in a specific exposure system. This means that lithographic masks are specifically designed for an actinic wavelength, a numerical aperture of the projection lens ($NA_M$) of the exposure system as well as the exposure setting specifically used by the exposure system for projecting the pattern of the lithographic mask into a photoresist. In this sense, the design of a lithographic mask determines or fixes its resolution limit.

The resolution limit of the lithographic mask can comprise a mask-side resolution limit of an exposure system suitable for exposing a wafer using the lithographic mask.

The mask-side resolution limit ($R_M$) can be determined by $$R_M = \frac{0.5 \cdot \lambda}{NA_M \cdot (1 + \sigma)},$$

wherein $\lambda$ is the actinic wavelength of the lithographic mask, $NA_M$ is the mask-side numerical aperture of the projection lens of the exposure system, and $\sigma$ is an exposure setting of the exposure system exposing the lithographic mask.

The mask-side resolution limit $R_M$ is proportional to the actinic wavelength $\lambda$ and inversely proportional to the mask-side numerical aperture $NA_M$. The $NA_M$ can have numerical values in the range of approximately 0.1 to 0.5. Furthermore, the resolution limit of the lithographic mask is dependent on the exposure setting $\sigma$ of the exposure system that exposes a wafer by using the lithographic mask. The numerical values of $\sigma$ range from 0 (for central illumination) to 1 (for maximally oblique illumination). Oblique exposure is also referred to as off-axis exposure in the technical field.

Depending on the numerical aperture $NA_M$ and the exposure setting $\sigma$, the resolution limit for photomasks that are exposed with the deep ultraviolet (DUV) wavelength $\lambda$=193 nm is between 150 nm≤$R_M$≤300 nm. For EUV masks with an actinic wavelength of $\lambda$=13.5 nm, the resolution limit is currently in a range of 50 nm≤$R_M$≤100 nm. This means that the range within which one numerical value of one parameter or the numerical values of a plurality of parameters of the repair shape can be chosen shrinks as the actinic wavelength of the photolithographic mask decreases. To put it another way, the method defined above opens up a larger range of new degrees of freedom in the DUV wavelength range than in the EUV range.

The deviation of the numerical value of the at least one parameter can comprise a range of 2% to 80%, preferably 2% to 50%, and most preferably 2% to 30%, of a resolution limit of the lithographic mask.

A dimensional size of at least one dimension of the at least one repair shape can comprise a range of 10% to 90%, preferably 20% to 80%, more preferably 30% to 70%, and most preferably 40% to 60%, of a dimensional size of the corresponding dimension of the at least one defect.

The dimensional size of the at least one dimension of the at least one repair shape can comprise at least one lateral dimension and/or a height of the at least one repair shape.

A distance between the at least one repair shape and the at least one defect can comprise a range of 2% to 80%, preferably 2% to 50%, more preferably 2% to 30%, and most preferably 2% to 10%, of a resolution limit of a defect-free region of the lithographic mask.

The repair shape can have a lateral displacement in relation to the nominal repair shape, the repair shape can have lateral deviations of its dimensional sizes in relation to the nominal repair shape, and the repair shape can have a deviation of its height in relation to the nominal repair shape, such that the repair shape and the nominal repair shape produce substantially the same optical intensity distribution in a photoresist. This means that the lateral dimensional size(s) and the height of a repair shape can be coupled or correlated. By way of example, a small height of a repair shape can be compensated for by increasing one or both lateral dimensional sizes, and vice versa. Furthermore, a correlation between the height or the lateral dimensional size(s) of a repair shape and a lateral displacement of the repair shape in relation to a defect is also possible. The details depend on the repair shape, the surroundings of the mask in which the repair shape is produced, and the exposure process.

The at least one defect can comprise at least one element from the group: an edge placement error of a pattern element, an interrupted and/or a bridged connection of a pattern element, an outlier of an edge roughness of a pattern element, a particle adhering on the lithographic mask, a lateral defect having only low printability, a defect residue of a defect repair carried out, a sidewall angle error of a pattern element, and a center of gravity error of a pattern element and/or of a distance range between two pattern elements.

Ascertaining the parameters for the at least one repair shape can comprise: recording at least one aerial image of the at least one defect. An aerial image can be measured with the aid of a mask inspection apparatus. A mask inspection apparatus can comprise an optical inspection apparatus and/or an inspection apparatus that scans the mask surface. An optical mask inspection apparatus can comprise a laser interferometer, for example, and a mask inspection apparatus that scans the mask surface can comprise an atomic force microscope, for example. An optical mask inspection apparatus can be designed to record an aerial image and/or an aerial image focus stack of a photomask.

Recording the at least one aerial image can comprise: recording the at least one aerial image of the at least one defect at an actinic wavelength of the lithographic mask, and/or recording an aerial image focus stack of the at least one defect. Recording the aerial image at the actinic wavelength shows in the aerial image the details which are imaged during later exposure of the photomask in the photoresist. Recording an aerial image at the actinic wavelength of said mask is therefore advantageous. It is even more expedient to determine the imaging behavior of a defective region of a photolithographic mask during tuning through the focus of said mask.

Ascertaining the parameters for the at least one repair shape can comprise: scanning the at least one defect by use of a scanning particle microscope and/or a scanning probe microscope. Furthermore, ascertaining the parameters for the at least one repair shape can comprise: recording at least one aerial image of the at least one defect and scanning the at least one defect by use of a scanning particle microscope and/or a scanning probe microscope.

A scanning particle microscope can comprise at least one element from the group: a scanning electron microscope (SEM), a scanning ion microscope (FIB, Focused Ion Beam), and a scanning electron microscope with polarization analysis (SEMPA).

A scanning probe microscope can comprise at least one element from the group: a scanning tunneling microscope (STM), an atomic force microscope (AFM), a magnetic force microscope (MFM), a scanning near-field optical microscope (SNOM) and a scanning near-field acoustic microscope (SNAM).

Ascertaining the parameters of the at least one repair shape can additionally be based on at least one element from the group: an exposure setting with which the lithographic mask is exposed during operation, design data of the lithographic mask, refractive index data of a deposited material for repairing a defect of missing material, and RET techniques of resolution enhancement for the lithographic mask.

Ascertaining the parameters of the at least one repair shape can comprise: applying at least one algorithm to measurement data of the at least one defect and design data of the lithographic mask.

The at least one algorithm can be realized using hardware, software, firmware or a combination thereof. Furthermore, the at least one algorithm can be stored in a non-volatile memory. In particular, the at least one algorithm can be stored in a solid state memory (SSD, Solid State Drive).

Allocating the numerical value can comprise: applying a trained machine learning model for determining the deviation of the numerical value of the at least one parameter from the numerical value predefined by the at least one defect for said parameter.

The machine learning model can comprise a transformation model having at least two transformation blocks, wherein the at least two transformation blocks at least each comprise a generically learnable function that converts inputs into outputs that are used as inputs for a subsequent transformation block. The machine learning model can comprise at least one element from the group: a parametric mapping, an artificial neural network, a deep neural network, a time-delayed neural network, a convolutional neural network, a recurrent neural network, a long short-term memory network, a generative model, a kernel density estimator, a statistical model, a decision tree, a linear model, and a time-invariant model.

The machine learning model can comprise: (a) at least one encoder block for determining information-carrying features of an image of the at least one defect and the design data assigned to the image of the at least one defect; and (b) at least one decoder block for producing at least one effect of the at least one defect from the determined information-carrying features, wherein the at least one effect of the at least one defect shows what a superimposition of the image of the at least one defect with the corresponding design data looks like.

Ascertaining the parameters of the at least one repair shape can comprise: applying a trained machine learning model for ascertaining the parameters of the at least one repair shape.

A trained machine learning model can be used in at least two embodiments of a method described above. Firstly, a correspondingly trained machine learning model can be used to allocate to one or more parameters of a repair shape a numerical value or numerical values that deviate(s) from that or those as a result of the at least one defect. However, it is also possible—and this is the currently preferred embodiment—for a correspondingly trained machine learning model to ascertain all parameters of the at least one repair shape for repairing the at least one defect on the basis of measurement data, for example one or more aerial images of the defect, design data of the mask and optionally structures of one or more RET techniques.

The method according to the invention can furthermore comprise the step of: producing at least one repair element on the lithographic mask by use of the ascertained repair shape. Implementing the repair shape produces on the photomask a repair element that is designed as far as possible to eliminate, i.e. to repair or to compensate for, the at least one defect.

The at least one repair element may not be imaged during the exposure of the photolithographic mask. The at least one repair element may change an imaging behavior of the at least one defect during the exposure of the lithographic mask.

A produced repair element typically has deviations in relation to a nominal repair shape that are below the resolution limit of the photolithographic mask, and for this reason may not be imaged in a photoresist, and thus in the wafer situated underneath, during the exposure of the mask with the actinic wavelength. However, the repair element generated on the mask is designed such that it changes the imaging behavior of the defective region of the photomask, such that the defective region in combination with the repair element brings about an imaging behavior that is very similar to a defect-free region with an identical pattern arrangement. As a result, during an exposure process, the repaired mask produces substantially the same edge position as a defect-free mask. The effect of the at least one repair element is based at least partly on diffraction effects of the actinic exposure radiation at the repair element.

Producing the at least one repair element can comprise: carrying out at least one local etching process and/or carrying out at least one local deposition process by use of at least one focused particle beam and at least one precursor gas.

The at least one focused particle beam can comprise at least one element from the group: a photon beam, an electron beam, an ion beam, an atomic beam and a molecular beam.

The at least one precursor gas can comprise at least one element from the group: an etching gas, a deposition gas and an additive gas.

The etching gas can comprise at least one element from the group: a halogen ($F_2$, $Cl_2$, $Br_2$, $J_2$), oxygen ($O_2$), ozone ($O_3$), hydrochloric acid (HCl), hydrogen fluoride (HF), xenon difluoride ($XeF_2$), xenon tetrafluoride ($XeF_4$), xenon hexafluoride ($XeF_6$), xenon chloride (XeCl), argon fluoride (ArF), krypton fluoride (KrF), sulfur difluoride ($SF_2$), sulfur tetrafluoride ($SF_4$), sulfur hexafluoride ($SF_6$), nitrosyl chloride (NOCl), phosphorus trichloride ($PCl_3$), phosphorus pentachloride ($PCl_5$), phosphorus trifluoride ($PF_3$), nitrogen trifluoride ($NF_3$), water vapor ($H_2O$), hydrogen peroxide ($H_2O_2$), nitrous oxide ($N_2O$), nitrogen oxide (NO), nitrogen dioxide ($NO_2$) and nitric acid ($HNO_3$).

The at least one deposition gas can comprise at least one element from the group: a metal alkyl, a transition element alkyl, a main group alkyl, a metal carbonyl, a transition element carbonyl, a main group carbonyl, a metal alkoxide, a transition element alkoxide, a main group alkoxide, a metal complex, a transition element complex, a main group complex and an organic compound.

The metal alkyl, the transition element alkyl and the main group alkyl can comprise at least one element from the group: cyclopentadienyl (Cp) trimethyl platinum (CpPtMe$_3$), methylcyclopentadienyl (MeCp) trimethyl platinum (MeCpPtMe$_3$), tetramethyltin (SnMe$_4$), trimethylgallium (GaMe$_3$), ferrocene (Co$_2$Fe) and bisarylchromium (Ar$_2$Cr).

The metal carbonyl, the transition element carbonyl and the main group carbonyl can comprise at least one element from the group: chromium hexacarbonyl (Cr(CO)$_6$), molybdenum hexacarbonyl (Mo(CO)$_6$), tungsten hexacarbonyl (W(CO)$_6$), dicobalt octacarbonyl (Co$_2$(CO)$_8$), triruthenium dodecacarbonyl (Ru$_3$(CO)$_{12}$) and iron pentacarbonyl (Fe(CO)$_5$).

The metal alkoxide, the transition element alkoxide and the main group alkoxide can comprise at least one element from the group: tetraethyl orthosilicate (TEOS, Si(OC$_2$H$_5$)$_4$) and tetraisopropoxytitanium (Ti(OC$_3$H$_7$)$_4$). The metal halide, the transition element halide and the main group halide can comprise at least one element from the group: tungsten hexafluoride (WF$_6$), tungsten hexachloride (WCl$_6$), titanium hexachloride (TiCl$_6$), boron trichloride (BCl$_3$) and silicon tetrachloride (SiCl$_4$).

The metal complex, the transition element complex and the main group complex can comprise at least one element from the group: copper bis(hexafluoroacetylacetonate) (Cu(C$_5$F$_6$HO$_2$)$_2$) and dimethylgold trifluoroacetylacetonate (Me$_2$Au(C$_5$F$_3$H$_4$O$_2$)).

The organic compound can comprise at least one element from the group: carbon monoxide (CO), carbon dioxide (CO$_2$), an aliphatic hydrocarbon, an aromatic hydrocarbon, a constituent of vacuum pump oils and a volatile organic compound. An aromatic hydrocarbon can comprise styrene.

The at least one additive gas can comprise at least one element from the group: an oxidizing agent, a halide and a reducing agent.

The oxidizing agent can comprise at least one element from the group: oxygen (O$_2$), ozone (O$_3$), water vapor (H$_2$O), hydrogen peroxide (H$_2$O$_2$), nitrous oxide (N$_2$O), nitrogen oxide (NO), nitrogen dioxide (NO$_2$) and nitric acid (HNO$_3$). The halide can comprise at least one element from the group: chlorine (Cl$_2$), hydrochloric acid (HCl), xenon difluoride (XeF$_2$), hydrogen fluoride (HF), iodine (I$_2$), hydrogen iodide (HI), bromine (Br$_2$), hydrogen bromide (HBr), nitrosyl chloride (NOCl), phosphorus trichloride (PCl$_3$), phosphorus pentachloride (PCl$_5$) and phosphorus trifluoride (PF$_3$). The reducing agent can comprise at least one element from the group: hydrogen (H$_2$), ammonia (NH$_3$) and methane (CH$_4$).

The at least one repair element produced can at least partly overlap the at least one defect. A deposited repair element can comprise a material of the lithographic mask. The deposited repair element can comprise: a metal, for instance chromium (Cr), a metal compound, for instance tantalum nitride (TaN), silicon (Si), silicon dioxide (SiO$_2$) and molybdenum silicon oxynitride (Mo$_x$SiO$_y$N$_z$), wherein $0<x\leq0.5$, $0\leq y\leq2$ and $0\leq z\leq4/3$. An etched repair element can etch a material of the photolithographic mask. The etched repair element can comprise the mask materials mentioned above.

The method defined above can comprise the steps of: (a) producing at least one repair element by use of at least one repair shape for which the parameters are defined by the at least one defect; and (b) ascertaining parameters of a repair shape for a remaining defect residue, wherein ascertaining parameters for the repair shape for the remaining defect residue comprises: allocating at least one numerical value to a parameter which deviates from the numerical value predefined by the remaining defect residue for said parameter.

The method defined above can be used as a second stage of a general defect repair process. In this case, in a first stage, a large defect, i.e. a defect that is large vis-à-vis the resolution limit of the photomask, can be repaired by implementing a repair shape in the form of a local etching process or in the form of a local deposition process or by producing the corresponding repair element. The repaired mask is then inspected. If it is established during the inspection of the mask that a repaired location still does not always fulfil the specification, a repair shape is determined for the residual defect residue, the parameters of which repair shape are determined in accordance with the method according to the invention. It is assumed here that the residual defect residue constitutes a small defect, i.e. a defect having at least one dimensional size in at least one dimension which is smaller than the resolution capability or the resolution limit of the photolithographic mask. The residual defect residue can subsequently be repaired or compensated for by producing the corresponding repair element on the basis of the repair shape ascertained in the second step.

In a second embodiment, the method for repairing at least one defective pattern element of a lithographic mask comprises the steps of: (a) determining at least one repair element of the lithographic mask which does not image the lithographic mask during the exposure thereof, wherein the at least one repair element is configured to change an imaging behavior of the at least one defective pattern element; and (b) producing the at least one repair element on the lithographic mask by use of at least one focused particle beam and at least one precursor gas.

The at least one repair element produced can have in at least one dimension a dimensional size which is smaller than the resolution limit R of the photomask. As already explained above, the averaging of the actinic radiation over structures with dimensional sizes below the resolution capability of the mask results in a reduced effect of a placement error of a repair element. This circumstance significantly facilitates the positioning of the repair element(s) in relation to the position of a defect to be repaired. Furthermore, by virtue of the non-imaging of the repair element(s), the geometric shape(s) thereof can deviate from the shape of the defect in a significant way, without the compensation of the defect being adversely influenced in an appreciable way. This fact considerably simplifies the repair or the compensation of small defects.

However, the repair element(s) produced on the mask locally change(s) the diffraction behavior of the mask at the actinic wavelength. The repair element(s) is (are) designed, then, such that said repair element(s) in combination with the defective pattern element substantially realize the imaging behavior of a corresponding defect-free region of the photolithographic mask.

The at least one repair element can have at least one dimensional size which comprises a range of 10% to 90%, preferably 20% to 80%, more preferably 30% to 70%, and most preferably 40% to 60%, of a resolution limit of the lithographic mask.

A distance between the at least one repair element and the at least one defective pattern element can comprise a range of 2% to 80%, preferably 2% to 50%, more preferably 2% to 30%, and most preferably 2% to 10%, of the resolution limit of the lithographic mask.

At least one-dimensional size of the at least one repair element can comprise a range of 10% to 90%, preferably 20% to 80%, more preferably 30% to 70%, and most preferably 40% to 60%, of the resolution limit of the lithographic mask.

Further aspects of a repair element have been described above in connection with the first embodiment.

A computer program can comprise instructions which, when the latter are executed by a computer system, cause the computer system to carry out the method steps of one of the aspects indicated above.

In one embodiment, the apparatus for repairing at least one defect of a lithographic mask comprises means for ascertaining parameters of at least one repair shape for the at least one defect, wherein the means for ascertaining parameters comprises: means for allocating a numerical value to at least one parameter which deviates from the numerical value predefined by the at least one defect for said parameter.

The apparatus can furthermore comprise means for producing the at least one repair element on the lithographic mask by use of the ascertained repair shape.

The means for ascertaining parameters of the at least one repair shape can comprise at least one coprocessor configured to determine the parameters of the at least one repair shape from measurement data of the at least one defect and design data of the lithographic mask. Furthermore, the at least one coprocessor can be configured to allocate to the at least one corresponding parameter at least one numerical value which deviates from the numerical value predefined by the at least one defect. Allocating the deviating numerical value of the at least one corresponding parameter can be effected on the basis of the resolution limit of the lithographic mask and the resolution limit when producing the at least one repair element.

The resolution limit when producing the at least one repair element is essentially influenced by two parameters. The first parameter is the minimum spot diameter to which a particle beam for producing a repair element can be focused. In the case of a photon beam, the achievable spot diameter is determined by the wavelength of the photons. In order to produce a repair element on a mask for the DUV wavelength range with the aid of a photon beam, photons from the EUV wavelength range are necessary. EUV photon sources are still very expensive at the present time. It is therefore advantageous, for the purpose of generating a repair element, to use a particle beam having mass, for example an electron beam, the resolution limit of which is given by the de Broglie wavelength. Electron beams can currently be focused to a spot diameter in the range of a few nanometers. The positioning accuracy of an electron beam is significantly higher and extends into the sub-nanometer range.

The second parameter that determines the resolution limit when producing a repair element is the interaction region or the scattering cone of the secondary electrons generated by a particle beam having mass. The diameter of said interaction region on the mask surface determines the extent of the local chemical reaction initiated by the particle beam and the at least one precursor gas. The size of the interaction region depends on the energy of the particles incident on the photomask. Furthermore, the local material composition of the photomask at the interaction site has a significant influence on the size of the interaction region. Currently, local chemical reactions may be restricted to lateral dimensions of approximately 5 nm.

The means for ascertaining parameters of the at least one repair shape can comprise at least one algorithm embodied as an application specific integrated circuit (ASIC), as a complex programmable logic circuit (CPLD, Complex Programmable Logic Device) and/or as a field programmable gate array (FPGA).

The means for ascertaining parameters of the at least one repair shape can comprise at least one trained machine learning model. Furthermore, the means for allocating to at least one corresponding parameter a numerical value that deviates from the numerical value predefined by the at least one defect can comprise a trained machine learning model.

The means for ascertaining parameters of the at least one repair shape can comprise at least one element from the group: a mask inspection apparatus, an interferometer, a confocal microscope, a scanning particle microscope and a scanning probe microscope. An element from said group can record measurement data from the at least one defect.

The means for producing the at least one repair element can comprise: at least one focused particle beam and at least one precursor gas, which are configured to carry out a local chemical reaction.

In a second embodiment, the apparatus for repairing at least one defective pattern element of a lithographic mask comprises: (a) means for determining at least one repair element of the lithographic mask which does not image the lithographic mask during the exposure thereof, wherein the repair element is configured to change an imaging behavior of the at least one defective pattern element; and (b) means for providing a focused particle beam and at least one precursor gas which are configured to produce the at least one repair element on the lithographic mask.

The means for determining at least one repair element can comprise at least one coprocessor configured to determine the at least one repair element from measurement data of the at least one defect and design data of the lithographic mask. Determining the at least one repair element can be effected on the basis of the resolution limit of the lithographic mask and a minimum spot size of the focused particle beam at the focus thereof.

The means for determining the at least one repair element of the lithographic mask can comprise at least one algorithm embodied as an application specific integrated circuit (ASIC), as a complex programmable logic circuit (CPLD, Complex Programmable Logic Device) and/or as a field programmable gate array (FPGA).

The means for determining the at least one repair element can comprise at least one trained machine learning model.

The means for determining the at least one repair element can comprise at least one element from the group: a mask inspection apparatus, an interferometer, a confocal microscope, a scanning particle microscope and a scanning probe microscope.

A further embodiment comprises a lithographic mask which is repaired according to any of the methods described above. The repaired lithographic mask can be used in an exposure system. Further, the repaired lithographic mask may be repaired based on at least one repair shape determined according to any of the aspects described above. Moreover, the repaired lithographic mask can contain at least one repair element generated by using the determined at least one repair shape. The lithographic mask can be repaired by performing a particle beam induced local deposition process and/or a local etching process.

In another embodiment an exposure system uses a lithographic mask repaired according to any of the above described method steps.

An exposure system may be a photolithographic exposure system. In particular, the exposure system may be a micro-lithographic projection exposure system. The exposure system may be any type of exposure system, as for example, an exposure system suitable for using transmissive lithographic masks and an exposure system suitable for using reflective lithographic masks.

A resolution limit of the exposure system can be determined by: a wavelength of a light source of the exposure system, a numerical aperture of a projection lens of the exposure system, and an exposure setting of the exposure system.

At least two resolution limits may be defined for an exposure system which refer to the two ends of the projection lens or the projection objective of the exposure system.

The resolution limit of the exposure system may be a wafer-side resolution limit of the projection lens of the exposure system.

The wafer-side resolution limit may be determined by $$R_W = \frac{0.5 \cdot \lambda}{NA_W \cdot (1 + \sigma)},$$

wherein $\lambda$ is the actinic wavelength of the lithographic mask, $NA_W$ is the wafer-side numerical aperture of the projection lens of the exposure system, and $\sigma$ is an exposure setting of the exposure system suitable for exposing the lithographic mask for projecting a pattern of the lithographic mask in a photoresist arranged on a wafer.

The NA on the wafer side of the projection lens, i.e. $NA_W$, is usually selected as large as possible in order to obtain a wafer-side resolution limit as low as possible. When using an immersion liquid, $NA_W$ can be larger than 1, for example 1.3.

A mask-side resolution limit of the projection lens of the exposure system can be determined by $$R_M = \frac{0.5 \cdot \lambda}{NA_M \cdot (1 + \sigma)},$$

wherein $\lambda$ is me actinic wavelength of the lithographic mask, $NA_M$ is the mask-side numerical aperture of the projection lens of the exposure system, and $\sigma$ is an exposure setting of the exposure system suitable for exposing the lithographic mask for projecting a pattern of the lithographic mask in a photoresist arranged on a wafer.

The ratio of the mask-side ($NA_M$) and the wafer-side numerical aperture ($NA_W$) defines the magnification M of the projection lens:

$$M = \frac{NA_M}{NA_W}.$$

For transmissive lithographic masks the magnification typically has numerical values of M=¼ or ⅕ for 4× and 5× reduction projection lenses. This means for an immersion projection lens having $NA_W$=1.2 and M=4, the mask-side numerical aperture $NA_M$ is 0.30. For reflective lithographic masks, the magnification may depend on the direction an exposure beam is scanned across a wafer. For example, M may be ⅛ in the scan direction and M may be ¼ in a direction perpendicular to the scan direction.

DESCRIPTION OF DRAWINGS

The detailed description that follows describes currently preferred exemplary embodiments of the invention with reference to the drawings, wherein:

FIG. 12 represents the repair of a defect of missing absorber material according to the scheme presented in FIG. 11;

FIG. 19 indicates a flowchart of a first embodiment of the method for repairing at least one defect of a lithographic mask;

FIG. 20 represents a flow diagram of a second embodiment of the method for repairing at least one defect of a lithographic mask;

DETAILED DESCRIPTION

Currently preferred embodiments of a method according to the invention and of an apparatus according to the invention for repairing one or more defects of a lithographic mask are explained in more detail below. Furthermore, exemplary embodiments of a method according to the invention and of an apparatus according to the invention for repairing a defective pattern element of a lithographic mask are explained in detail below. The methods according to the invention are described on the basis of the example of a binary photomask for the deep ultraviolet (DUV) wavelength range. However, they are not restricted to improving the repair of defective DUV masks. Furthermore, the methods according to the invention are principally explained on the basis of edge placement errors of pattern elements. However, these methods are not limited to repairing this type of errors. Rather, they can be used to facilitate the repair of, in particular, small defects of any type and for the various types of photolithographic masks. The masks can comprise transmissive and reflective photomasks. Furthermore, small defects of binary and/or phase shifting masks can be repaired just like small defects of masks for multiple exposure. Hereinafter, the term mask or photomask is also intended to encompass a template for nanoimprint lithography.

Furthermore, the apparatuses according to the invention for repairing one or more defects of lithographic masks are explained on the basis of the example of a modified scanning electron microscope. However, the apparatuses according to the invention can be realized not only on the basis of a scanning electron microscope. Rather, apparatuses according to the invention can be based on any scanning particle microscope, that is to say that an apparatus defined in this application can use any type of particle, preferably a type of particle having mass, for examining and/or for producing one or more repair elements of a photomask.

Figure 1:
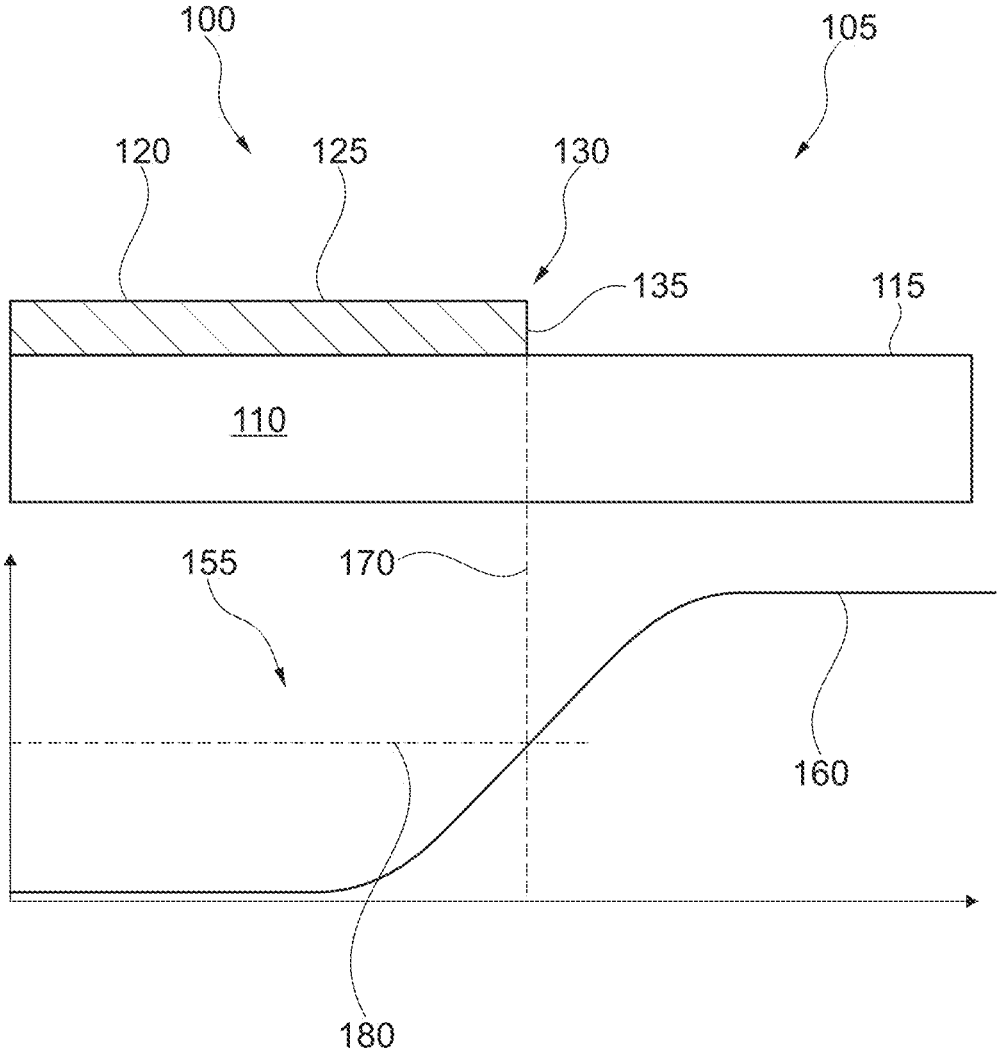
FIG. 1 in the upper partial image illustrates a schematic section through a pattern element of a photolithographic mask, said pattern element having an edge at the position predefined by the design, and in the lower partial image schematically represents an effective dose distribution of the optical intensity around the mask segment presented in the upper partial image in a photoresist during the exposure of the photomask.

The upper partial image 105 in FIG. 1 shows a schematic section through a one-dimensional (1D) segment of a photolithographic mask 100. The mask 100 can be a transmissive or a reflective mask 100. In the example in FIG. 1, the photomask 100 comprises a binary transmissive mask 100. The photolithographic mask 100 comprises a substrate 110 having a surface 115. A pattern element 120 or a structure element 120 having a surface 125 is arranged on the surface 115 of the substrate 110. The substrate 110 can comprise a quartz substrate and/or a material with a low coefficient of thermal expansion (LTE (low thermal expansion) substrate). In the case of a transmissive photomask 100, the substrate 110 thereof is substantially optically transparent to electromagnetic radiation at the actinic wavelength. The pattern element 120 can be a structure element 120 of a binary photomask 100. In this case, the pattern element 120 can comprise an element of an absorber structure 120 and can comprise chromium, for example. An absorbing pattern element 120 absorbs substantially the entire electromagnetic radiation at the actinic wavelength that is incident on the pattern element 120. For DUV masks, the thickness of a pattern element 120 is in the range of 60 nm to 200 nm. Absorbing pattern elements of EUV masks currently have a layer thickness in the range of 50 nm to 70 nm (not illustrated in FIG. 1).

Here and elsewhere in this description, the expression "substantially" denotes an indication of a measurement variable within the conventional measurement errors if measuring instruments in accordance with the prior art are used to determine the measurement variable.

Furthermore, it is possible for the pattern element 120 to comprise a structure element 120 which both shifts the phase of the actinic radiation relative to the radiation incident on the substrate 110 and absorbs part of the light at the actinic wavelength that is incident on the pattern element 120. Examples of such masks are AttPSM (Attenuated Phase Shifting Mask) based on molybdenum silicide or based on silicon nitride. Such masks usually transmit in the dark region 6% to 20% of the incident optical intensity with a phase shift by 180° in comparison with a transparent region of the photomask.

However, the pattern element 120 can also be a structure element 120 of a purely phase shifting photomask 100. A purely phase shifting mask 100 can be produced for example by etching a corresponding pattern into the substrate 110 of the mask 100, which substrate substantially comprises quartz ($SiO_2$) in this case. This type of mask is called a CPL (Chromeless Phase Shifting) mask. A further example of a type of purely phase shifting mask is AltPSM (Alternating Phase Shifting Mask) masks.

The upper partial image 105 in FIG. 1 shows an ideal edge 130 predefined by the design, said edge having a sidewall angle 135 of substantially 90°. Furthermore, the edge 130 is placed exactly at the location predefined by the design.

The lower partial image 155 in FIG. 1 schematically presents an effective dose distribution of the optical intensity 160 during the exposure of the pattern element 120 of the photomask 100. The pattern element 120 absorbs the radiation incident on the mask 100 from above, such that at some distance from the edge 130 below the pattern element 120 substantially no optical intensity is to be found in the photoresist of a wafer. In the transparent substrate region 110 of the mask 100, said substrate region being at a distance from the edge 130 of the pattern element 120, a photoresist applied to a wafer is exposed with the maximum optical intensity. The edge 130 of a pattern element 120 is typically defined as the location at which the optical intensity in the photoresist reaches 50% of the maximum optical intensity or of the maximum effective dose. In the lower partial image 155 in FIG. 1, this is illustrated by the point of intersection of the dashed vertical straight line 170 and the horizontal straight line 180.

Figure 2:
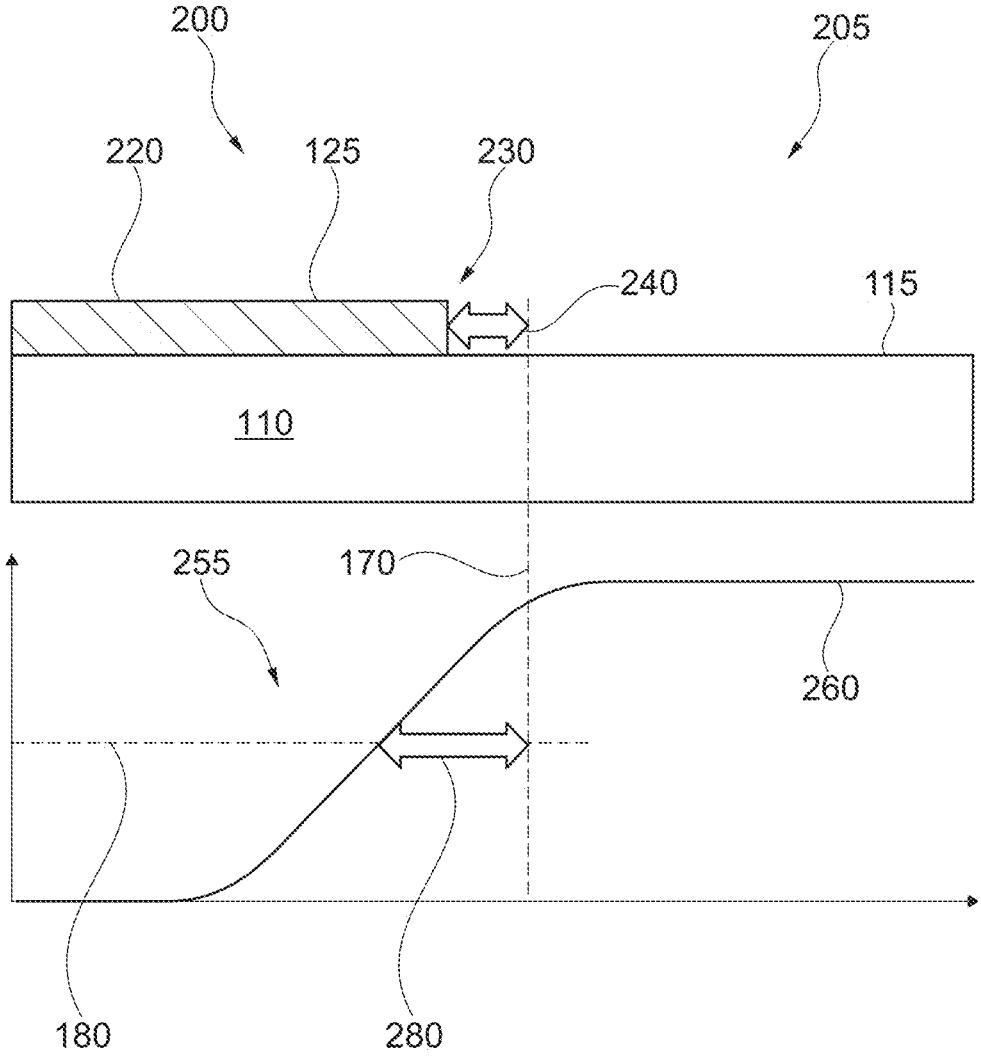
FIG. 2 in the upper partial image exhibits a schematic section through a mask with a defective pattern element, and in the lower partial image illustrates the effect of the defective pattern element on the effective dose distribution applied in a photoresist.

In the upper partial image 205 in FIG. 2, the edge 230 of the pattern element 220 is not placed at the position predefined by the design. Rather, the edge 230 is at a distance dx, illustrated by the horizontal double-headed arrow 240. The distance dx from the target position of the edge 230 as predefined by the design can arise as a result of an erroneous placement of the pattern element 220, the dimensional sizes of which have the values predefined by the design. In this case, the pattern element 220 can be corrected by ascertaining two repair shapes and producing two repair elements with the aid of said repair shapes. On the one hand, a first repair element defines the deposition of missing absorber material in the region identified by the double-headed arrow 240 in FIG. 2. On the other hand, a second repair shape specifies the removal of the excess absorber material, or absorber material positioned at the incorrect location, of the pattern element 220 (not illustrated in FIG. 2).

It is assumed hereinafter that that edge of the pattern element 220 which is not reproduced in the 1D illustration in FIG. 2 is positioned correctly, and that the pattern element 220 has to be corrected by the deposition of missing absorber material only in the region of the edge 230. Furthermore, it is assumed below that the defect 240 is a small defect. This means that the dimensional size dx of the one-dimensional defect 240 is smaller than the resolution limit of the photolithographic mask 200 at the actinic wavelength thereof. The positioning or placement accuracy of an edge 130, 230 of a pattern element 120, 220 is of crucial importance in particular on account of the overlay problem for lithography systems which perform a plurality of exposure steps in order to fix a pattern element in a photoresist.

The lower partial image 255 in FIG. 2 shows the optical intensity distribution 260 or the effective dose distribution 260 produced by the erroneous placement or positioning of the edge 230 of the pattern element 220 in a photoresist arranged on a wafer during the exposure of the photolithographic mask 200 with actinic electromagnetic radiation. During the exposure of a wafer, the position error of the edge 230 of the pattern element 220, said error being described by dx in the one-dimensional example in FIG. 2, is translated by the mask 200 into an edge placement error EPE, illustrated schematically by the double-headed arrow 280 in the lower partial image 255 in FIG. 2. The relationship between the EPE 280 on the wafer and the mask defect 240 is described by the following relationship: EPE=mask error·MEEF·M. In this case, in the example represented in FIG. 2, the mask defect 240 or the mask error 240 denotes the fact that the edge 230 of the pattern element 220 is positioned erroneously by dx. The mask enhancement factor MEEF (Mask Error Enhancement Factor) stands for a magnification or enhancement of the mask defect 240 that is possibly caused by the mask 200. For reasons of simplicity, it is assumed hereinafter that the following holds true: MEEF=1. The factor M denotes the magnification or the reduction with which a projection lens of an exposure system images the pattern element 220 of the mask 200 onto a wafer. For currently used projection lenses, it holds true that: M=¼ or M=⅕. FIG. 2 and likewise the subsequent figures do not illustrate the relationship between a mask defect 240 and an EPE 280 in a manner true to scale.

An ideal repair of the mask defect 240 by perfect implementation of a perfect repair shape would place a repair element at the defective edge 230 of the pattern element 220, such that the defective pattern element 220 would look like the pattern element 120 illustrated in FIG. 1. However, this would require ideal positioning of a repair tool in relation to the edge 230 of the defective pattern element 220. Moreover, perfect repair of the defect 240 would presuppose that the resolution limit of the repair tool would be very small, ideally zero.

Figure 3:
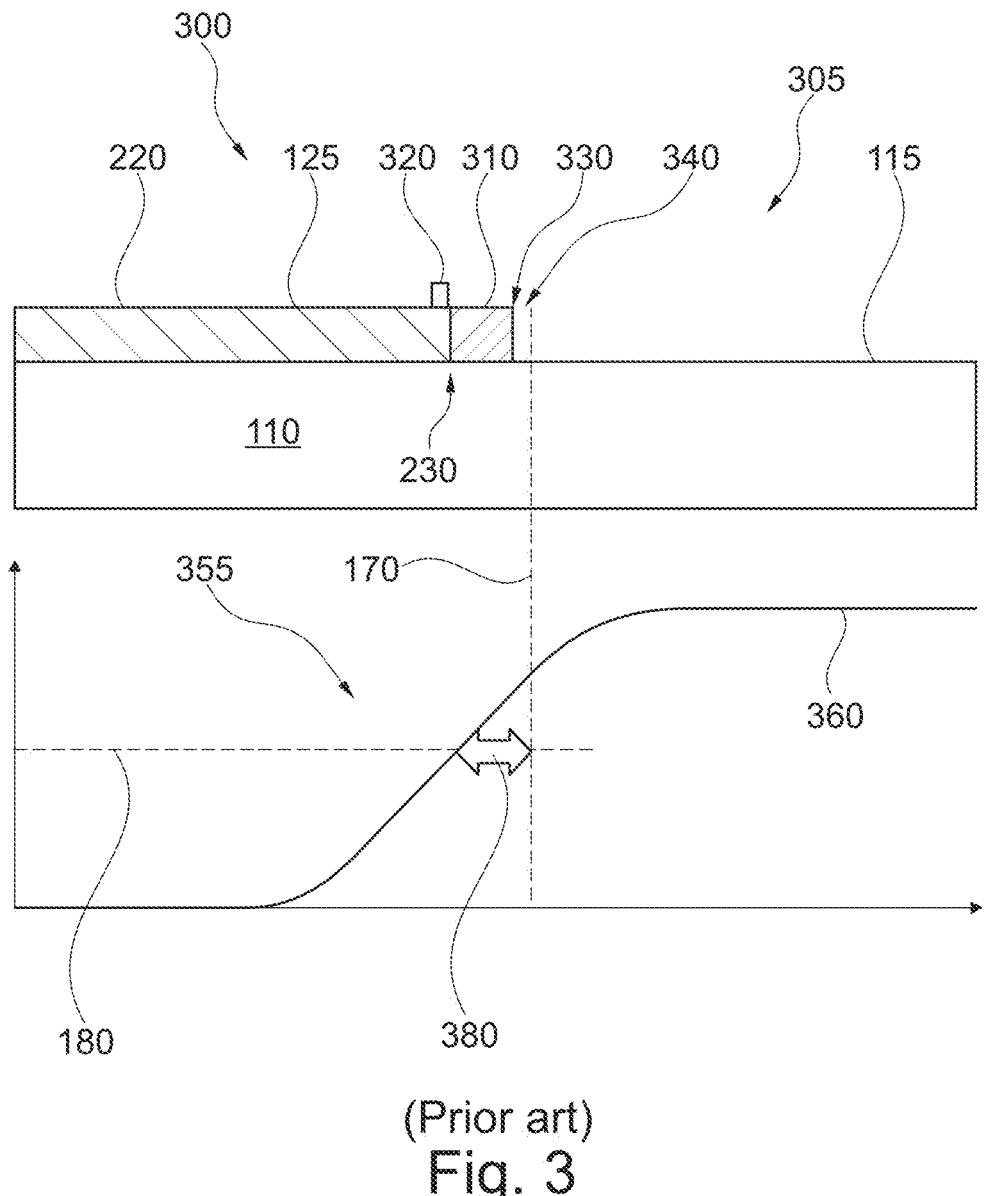
FIG. 3 in the upper partial image shows a repair of the defective pattern element of the photolithographic mask from FIG. 2 according to the prior art, and in the lower partial image illustrates the effect of the defect repair on the optical intensity distribution of the repaired mask segment from the upper partial image.

The upper partial image 305 in FIG. 3 illustrates a real repair of the defect 240 from FIG. 2 in accordance with the prior art. On account of the finite positioning accuracy of the repair tool, the latter cannot be aligned perfectly with the edge 230 of the defective pattern element 220. Therefore, the repair element 310 produced by the repair shape does not correspond ideally to the 1D dimensional size dx of the defect 240. Rather, on account of the limited positioning accuracy of the repair tool, the repair shape of the defect 240 produces a small part 320 of the repair element 310 on the surface 125 of the defective pattern element 220. For this reason, the edge 330 of the repair element 310 deviates from the position predefined by the design. The remaining defect 340 has a dimensional size dx'.

The lower partial image 355 in FIG. 3 illustrates the change in the optical intensity distribution 360 or of the EPE in a photoresist during the exposure of the repaired mask segment 300 from the upper partial image in FIG. 3. Compared with the exposure of the unrepaired mask 200, the repaired mask 300 comes significantly closer to the pattern geometry predefined by the design from FIG. 1. However, there still remains a discrepancy or an EPE 380, illustrated by the double-headed arrow 380, which brings about a CD (Critical Dimension) deviation of the repaired pattern element 220 that lies outside the permissible error budget of the mask 300. The defect 340 that remains after the repair in accordance with the prior art can be repaired or compensated for, as explained below. However, it is more advantageous to repair the defect 240 directly, i.e. in a single step, as described below with reference to FIG. 4.

Figure 4:
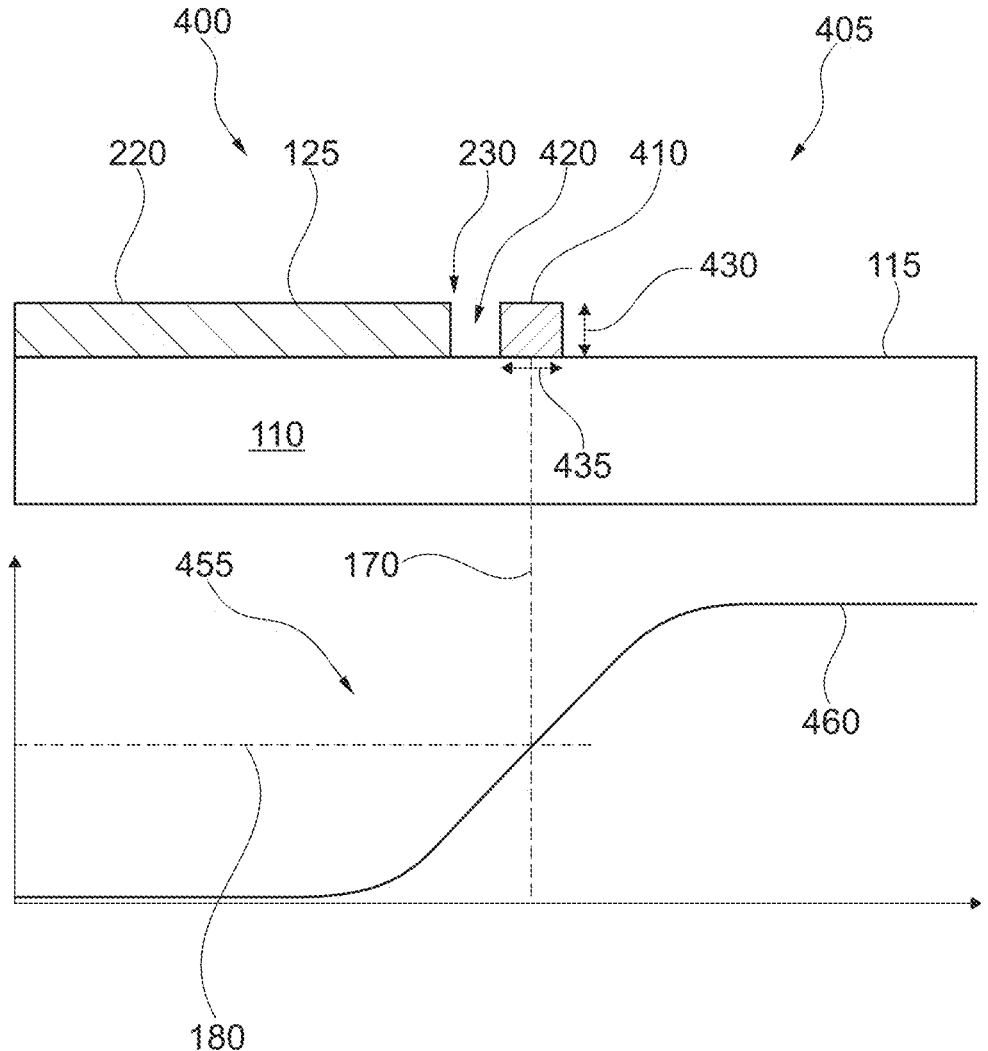
FIG. 4 in the upper partial image presents an ideal repair of the defective pattern element of the photolithographic mask from FIG. 2 on the basis of a method according to the invention, and in the lower partial image shows the optical intensity distribution generated by the optimally repaired photomask in the photoresist of a wafer.

FIG. 4 illustrates in the upper partial image 405 the best possible repair of the defective pattern element 220 from FIG. 2 according to one of the methods described in this application. The repair shape for correcting the defective pattern element 200 from FIG. 2 is designed such that implementing the repair shape generates a repair element 410 that is at a distance 420 from the edge 230 of the defective pattern element 220. The ideal distance 420 between the edge 230 of the defective pattern element 220 and the repair element 410 is approximately dx/2, i.e. half of the distance between the edge 230 and the vertical line 170 or the edge error 240 of the defective pattern element 220. For a height 430 of the repair element 410 that corresponds substantially identically to the height of the pattern element 220, the repair element 410 and thus the repair shape underlying the repair element 410 has a dimensional size corresponding to approximately 80% of the distance 240 between the edge 230 of the pattern element 220 and the vertical line 170. As already explained above, the mask-side resolution limit of DUV masks is in the range of 150 nm to approximately 300 nm, and that of EUV masks is in a range of approximately 50 nm to 100 nm.

The lower partial image 455 in FIG. 4 presents the optical intensity distribution 460 of the repaired photomask 400 having the repair element 410 arranged at a distance 420 from the edge 230 of the defective pattern element 220 of the photomask 200. A comparison of FIGS. 1 and 4 makes it clear that the optical intensity distribution 460 brought about by the combined effect of the defective pattern element 220 with the repair element 410 generates in a photoresist a pattern element that precisely realizes the edge 130 predefined by the design. The repair element 410 brings about the ideal production of a pattern element predefined by the design in a photoresist and thus on a wafer, even though the repair element 410 does not adjoin the edge 230, nor does the extent of the defect 240 correspond to the one-dimensional dimensional size 435 of the repair element 410.

The repair element 410 can be produced by a repair tool, which is explained below in the context of FIGS. 21 to 24, on the basis of a corresponding repair shape on the photomask 400. For this purpose, the repair tool can carry out a local chemical deposition reaction by use of a particle beam and at least one precursor gas. The material composition of the repair element 410 can correspond to the material composition of the pattern element 220. However, the material composition of the repair element 410 can also deviate from the material of the pattern element 220 as long as the material of the repair element 410 substantially completely absorbs the actinic wavelength of the photolithographic mask 420.

Figure 5:
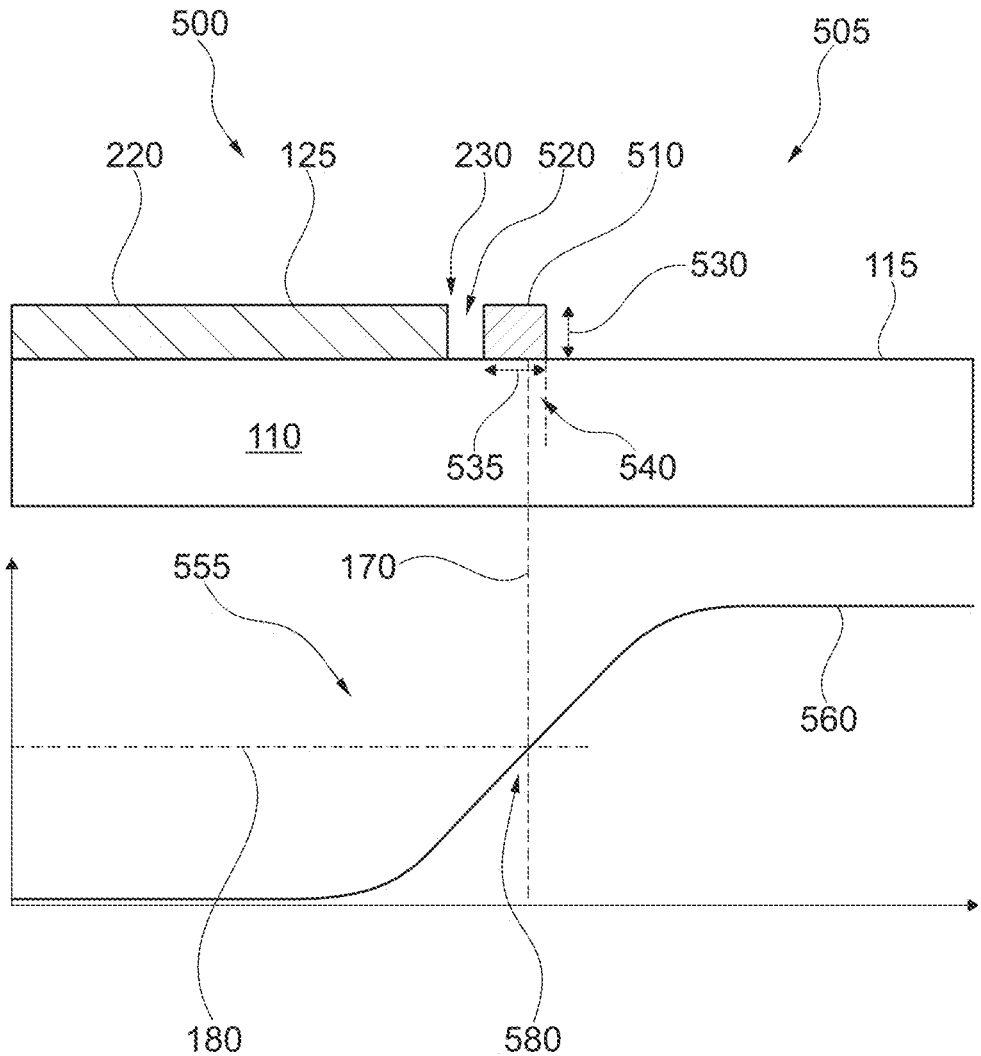
FIG. 5 in the upper partial image presents a real repair of the defective pattern element of the mask from FIG. 2 on the basis of a method according to the invention, and in the lower partial image illustrates the effect of the repaired photomask on the optical intensity distribution generated in a photoresist.

FIG. 4 represents perfect compensation of the defective pattern element 220 by the production of the repair element 410 at a distance 420 from the edge 230 of the defective pattern element 220. The upper partial image 505 in FIG. 5 represents a repair of the defective pattern element 220 that is able to be carried out in reality. On account of the finite positioning accuracy of a repair tool, the ascertained repair shape cannot position the repair element 510 exactly at the location provided for an optimum compensation of the defective pattern element. In the example illustrated in FIG. 5, the distance 520 of the edge 230 of the defective pattern element 220 is smaller than in the optimum repair of the defective pattern element 220 as illustrated in FIG. 4. As is evident from the lower partial image 555 in FIG. 5, the placement error 540 of the repair element 510 results in a scarcely perceptible deviation of the optical intensity distribution 560 compared with the ideal optical intensity distribution 460 in FIG. 4 in a photoresist applied to a wafer. This means that the EPE of the mask 500, illustrated by the arrow 580 in FIG. 5, is negligibly small after the repair of said mask by the production of the repair element 510.

This is caused by a stepped-down reduction of the placement error 540 of the repair element 510 during transfer into a photoresist, by approximately the factor $1/R_M$, wherein $R_M$ denotes the resolution limit of the photolithographic mask. This is one of the major advantages of the methods described here for repairing small defects of photolithographic masks. The sensitivity of the placement of a repair element 410, 510 to the EPE 580 is significantly reduced when the methods according to the invention are carried out. This reduction of the placement sensitivity of one or more repair elements 410, 510 is described by the resolution limit $R_M$ of the photolithographic mask 400, 500. The repair element 410, 510 can be placed at a distance of approximately 1% to 30% of the resolution limit $R_M$ of the photolithographic mask 400, 500, without the EPE 580, i.e. the repair or compensation of the pattern element 220, deviating by more than 10% from the best possible optical intensity distribution 460 in FIG. 4.

Figure 6:
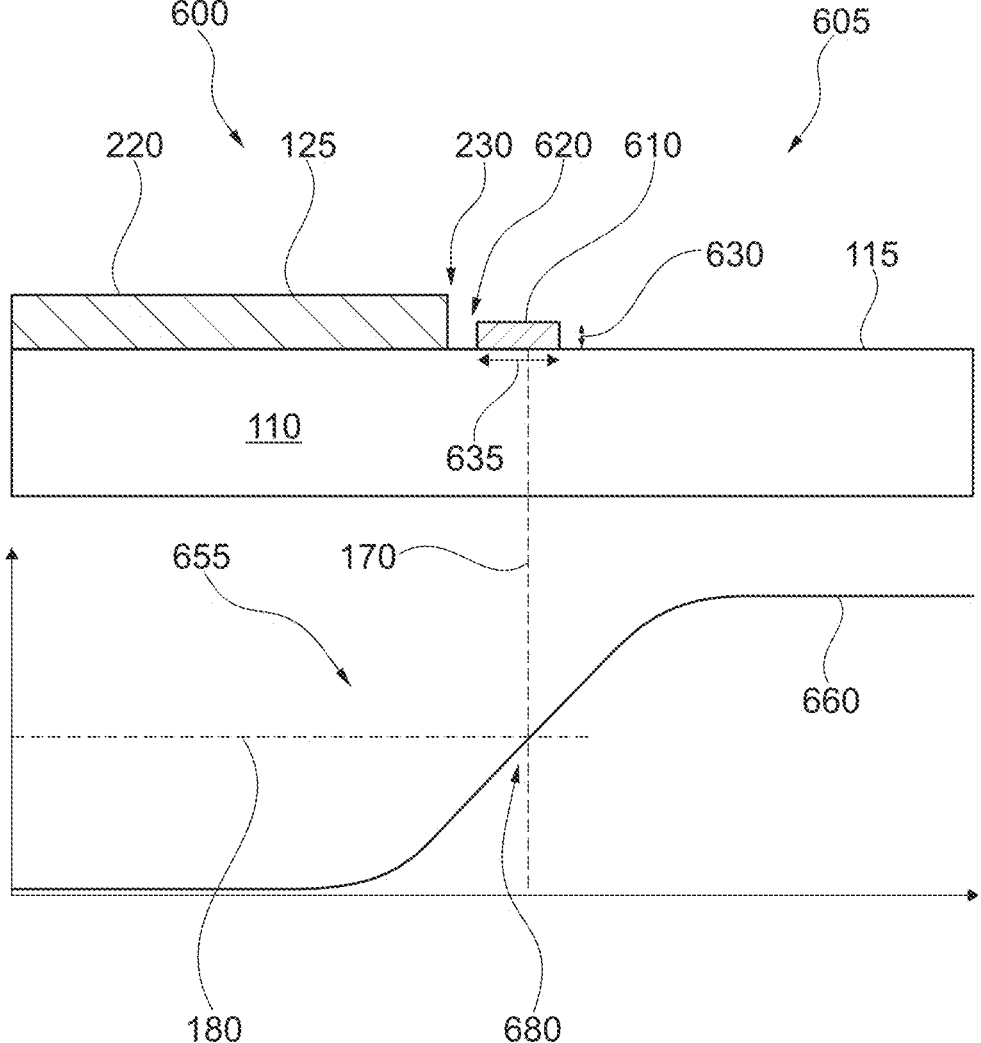
FIG. 6 schematically illustrates an alternative exemplary embodiment of a repair element for compensating for the defect from FIG. 2.

FIG. 6 illustrates a second example of a repair element 610 that can be used for repairing or compensating for the defective pattern element 220 from FIG. 2. Unlike the height 530 of the repair element 510 in FIG. 5, the height 630 of the repair element 610 in the upper partial image 605 in FIG. 6 is smaller than the height or thickness of the pattern element 220 of the mask 600. In order to compensate for the smaller height 630 of the repair element 610, the repair element 610 has a larger 1D dimensional size 635 than the repair element 510 from FIG. 5. As can be gathered from the lower partial image 655 in FIG. 6, the changed repair element 610 substantially does not lead to a change in the optical intensity distribution 660 in a photoresist. The EPE 680—in a manner similar to that in FIG. 5—is negligibly small.

Besides the reduced placement sensitivity of the repair elements 410, 510, 610, by implementing an ascertained repair shape it is possible to produce a repair element 410, 510, 610 whose lateral dimensional size 435, 535, 635 deviates significantly from the 1D dimensional size dx of the defect 240. The defect repair methods presented in this application have thus significantly reduced the sensitivity with which a parametrized repair shape transfers one or more lateral dimensional sizes of a defect 240 into a repair element 410, 510, 610. Besides the relaxed placement sensitivity, this is the second significant advantage of the methods for repairing small defects of photolithographic masks as described in this application. In particular, the repair element 410, 510, 610 can be significantly smaller than a defect 240 to be repaired. This circumstance has a favorable effect on the time required for the defect repair, i.e. the production of the repair element 410, 510, 610.

Figure 7:
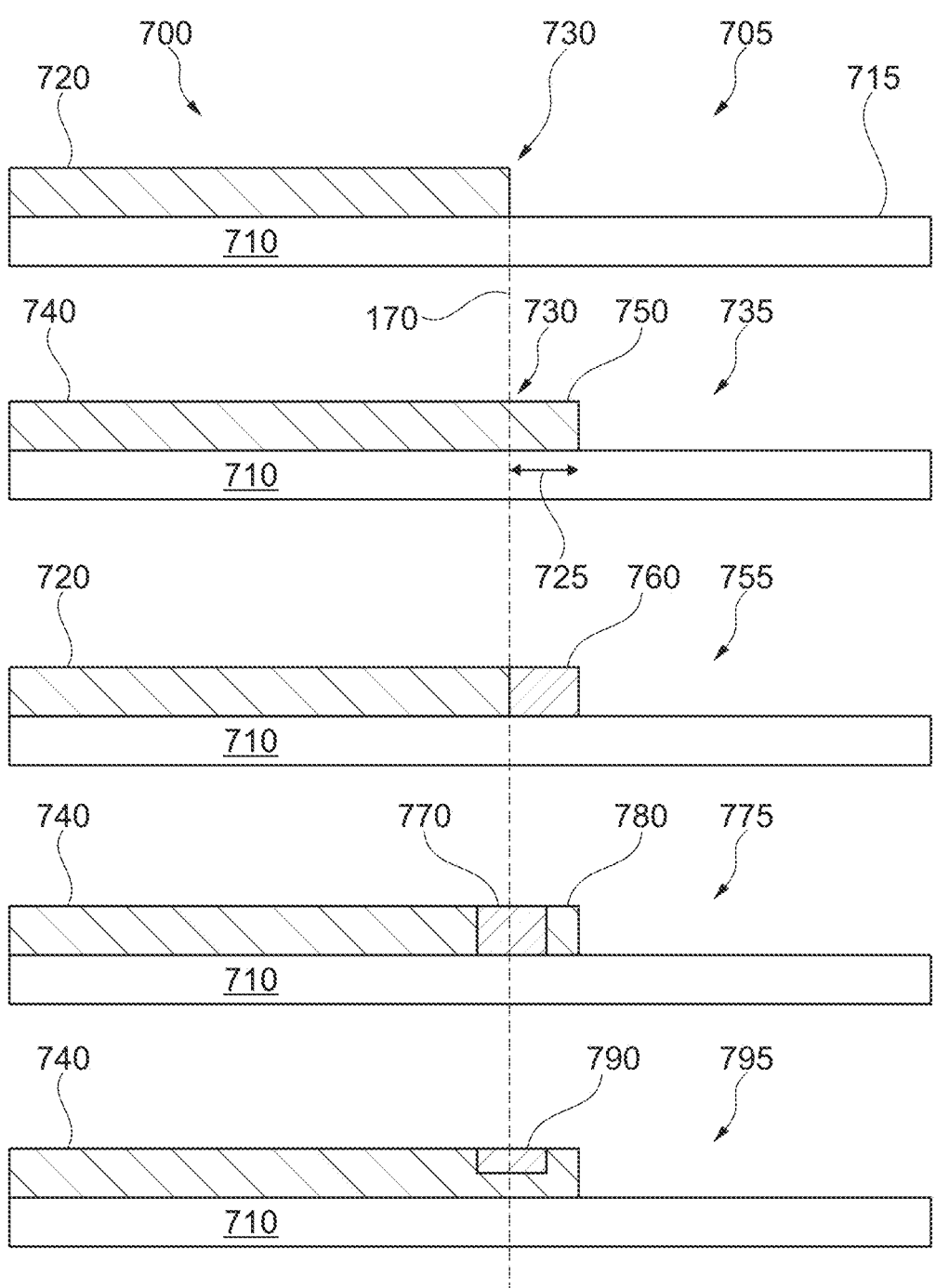
FIG. 7 in the upper partial image 715 schematically presents a perfectly placed edge of a pattern element, in the partial image 735 represents a pattern element having a defect of excess absorber material, in the partial image 755 represents the repairing of the defect from the partial image 735 in accordance with the prior art, in the partial image 775 illustrates the compensation of the defect from the partial image 735 by production of a repair element described in this application, and in the partial image 795 illustrates a second exemplary embodiment of a repair element according to the invention.

The application of the methods presented in this application for repairing a defect of missing absorber material, i.e. a clear defect, is explained in FIGS. 1 to 6. FIG. 7 explains how these methods can be used for repairing a defect of excess material, i.e. a so-called dark defect. The upper partial image 705 in FIG. 7 presents a pattern element 720 arranged on the surface 715 of a substrate 710 of the mask 700. The edge 730 of the pattern element 720 is positioned exactly at the location provided by the design, said location being identified by the dashed vertical line 170.

In the partial image 735 second from the top, the pattern element 740 has a defect 750 of excess material. The defect 750 has a 1D dimensional size 725 extending beyond the edge 730 of the defect-free pattern element 720. The defect 750 can be caused by an erroneous placement of a pattern element 720 whose dimensional sizes have precisely the magnitude provided by the design. As already discussed in the context of FIG. 2, however, it is also possible that too little absorber material was removed in the region of the edge 730 during the patterning of the mask 700.

The partial image 755 represents the repair of the defect 750 in accordance with the prior art. If ideal production of the repair element 760 is accomplished, the defect 750 can be repaired perfectly, as indicated in the partial image 755. The challenges associated with a repair of, in particular, small defects 750 in accordance with the prior art have already been explained in the discussion of FIG. 3.

The repair of the defect 750 of excess material by the production of a repair element 770 according to the invention is illustrated in the partial image 775. The repair element 770 is not designed for removing the excess material of the defect 750 by carrying out a local etching process. Rather, the production of the repair element 770 eliminates a part of the defect 750 and a small part of the defective pattern element 740. After the production of the repair element 770, the remaining defect residue 780 in combination with the repaired pattern element 740 influences the imaging behavior of the repaired mask 700 in the region of the repaired pattern element, such that this has an imaging behavior like the pattern element 720.

Finally, the bottommost partial image 795 in FIG. 7 presents a second repair element 790, which can be produced as an alternative to the repair element 770. The generation of the repair element 790 removes a part of the material of the defective pattern element 740 in the region of the edge 730 of the error-free pattern element 720. The 1D dimensional size of the repair element 790 is larger than the repair element 770. The larger 1D dimensional size of the repair element 790 is compensated for by virtue of the fact that the implementation of the repair shape underlying the repair element 790 does not etch the pattern element 740 down to the surface 715 of the substrate 710 of the mask 700.

The implementation of the repair elements 770, 790 for repairing the defect 740 opens up the additional degrees of freedom that were explained above in the context of FIGS. 5 and 6.

Figure 8:
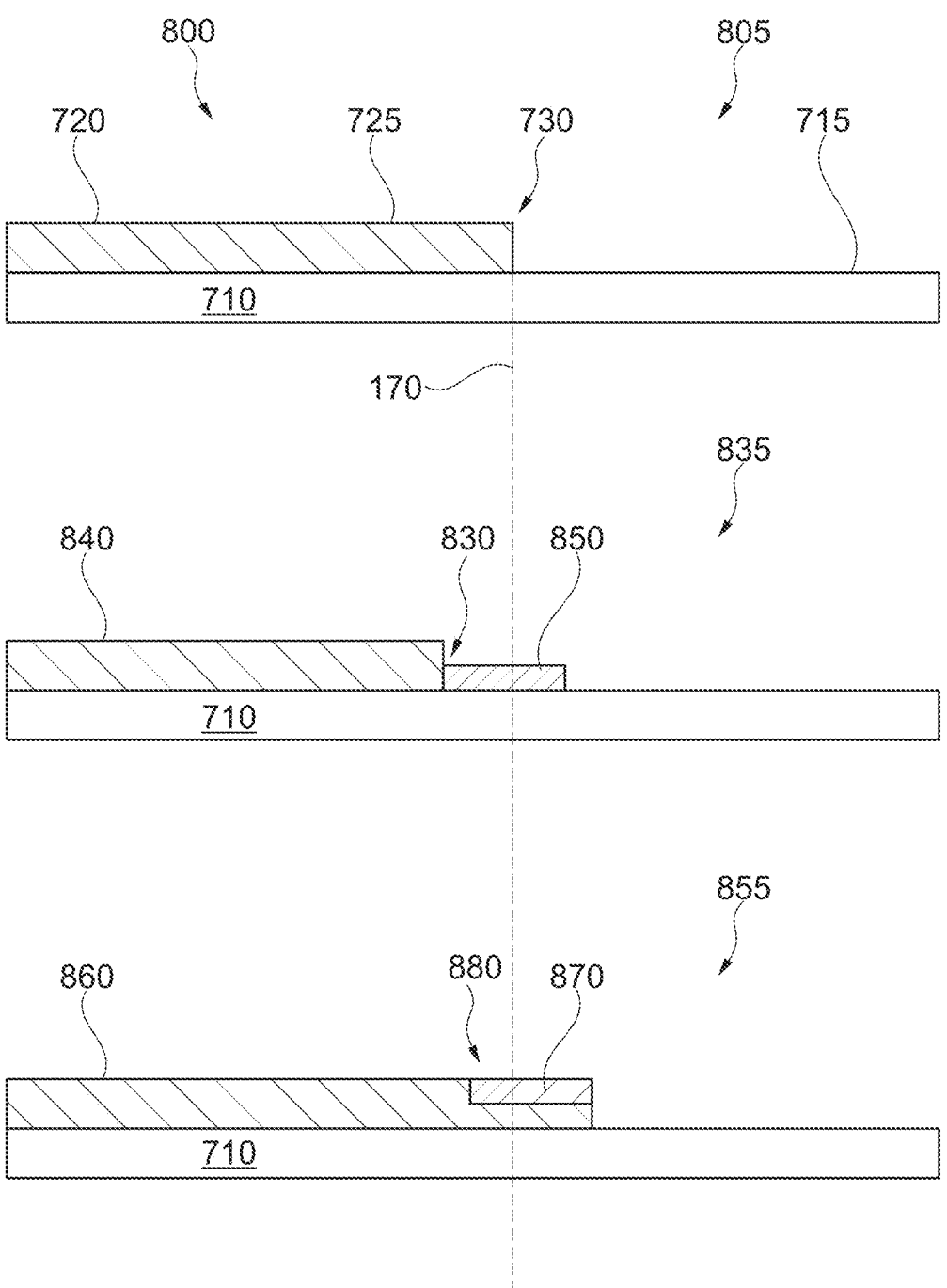
FIG. 8 in the upper partial image 805 represents a pattern element of a photolithographic mask, the edge of which pattern element is positioned exactly at the location provided by the design, in the central partial image 835 illustrates the repair of a defect of missing absorber material by production of a repair element according to the invention, and in the lower partial image 855 presents the repair of a defect of excess absorber material by generation of a repair element according to the invention.

FIG. 8 presents in the upper partial image 805 an absorbing pattern element 720 having a surface 725, which pattern element is arranged on the surface 715 of a substrate 710 that is optically transparent to the actinic wavelength of the photolithographic mask 800. The edge 730 of the pattern element 720 is positioned precisely at the location provided by the design. Said location is marked by the dashed vertical line 170 in FIG. 8.

The central partial image 835 in FIG. 8 represents a defective pattern element 840. The edge 830 of the pattern element 840 is not positioned at the location provided by the design of the mask. As a result, the pattern element 840 forms a clear defect or a defect of missing absorber material. In the partial image 835, the defect is compensated for by implementing a corresponding repair shape for producing a repair element 850. In the example in FIG. 8, the repair element 850 is adjacent to the edge 830 of the defective pattern element 840. The repair element 850 comprises deposited absorber material whose 1D dimensional size extends beyond the limit of missing absorber material. The height of the exemplary repair element 850 is approximately half the height of the pattern element 820, 840.

The lower partial image 855 in FIG. 8 presents a pattern element 860 having a defect of excess absorber material. The defect of excess material is repaired by removing an upper part of the excess absorber material by producing the repair shape 870. The edge 880 of the repaired pattern element 860 does not correspond to the position predefined by the design, said position being indicated by the dashed line 170 in FIG. 8. Nevertheless, the repair element 870 eliminates the effect of the defect of excess material apart from a negligibly small portion.

On account of the reduced placement requirements made of the repair tool, the production of the repair elements 850, 870 can be carried out with less outlay compared with the production of the repair elements 310, 760 in accordance with the prior art.

Figure 9:
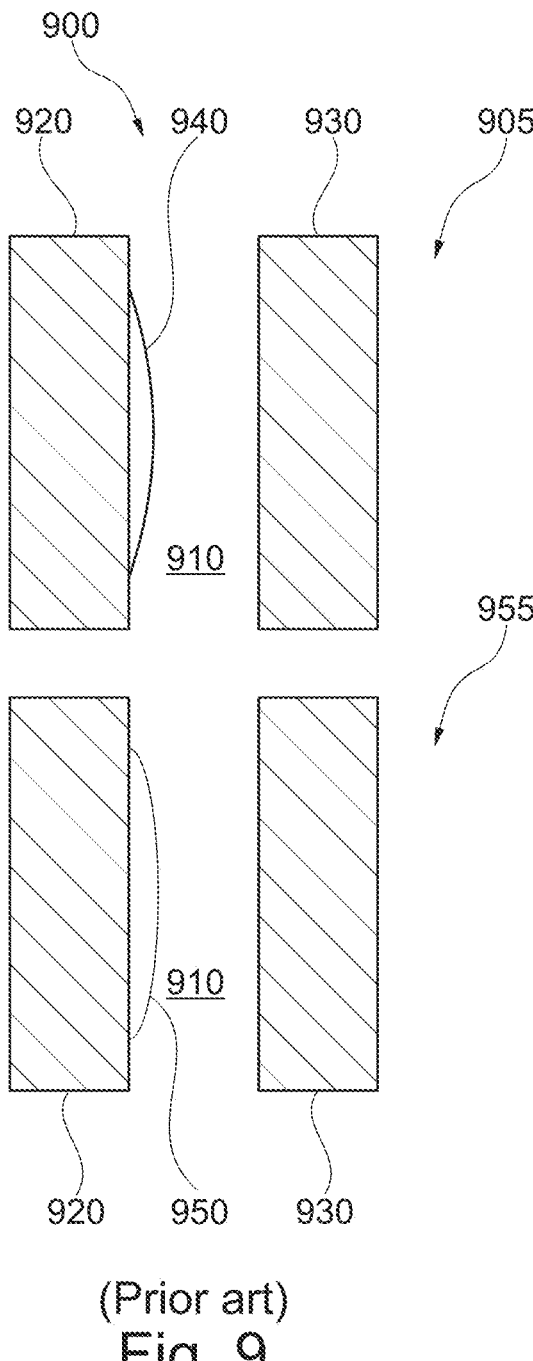
FIG. 9 in the upper partial image presents a schematic plan view of a strip structure with a defect, and in the lower partial image represents the strip structure after the repair of the defect in accordance with the prior art.

FIG. 9 presents in the upper partial image 905 a schematic plan view of a mask segment 900 having a strip structure ("lines and space pattern") having two absorbing strips 920 and 930 arranged on an optically transparent substrate 910. In the example illustrated in FIG. 9, the left pattern element 920 has a two-dimensional (2D) defect 940 of excess absorbing material.

The lower partial image 955 in FIG. 9 illustrates the repair of the defect 940 by carrying out a local etching process with the aid of a particle beam and an etching gas. In the example of a repair process represented in the lower partial image 955 in FIG. 9, the defect 940 has been almost perfectly eliminated apart from a negligible defect residue 950. In general, the laterally extended defect 940 cannot be removed in as exact a manner as represented in the lower partial image 955 in FIG. 9. As already explained above, the precision with which a repair tool or the repair shape of the defect 940 can be positioned in relation to the defect 940 or relative to the pattern element 920 is finite. Moreover, both the photomask 900 and the repair shape are subject to drift, for instance thermal drift, during the production of a repair element. The repaired pattern element 920 therefore often has along the processed right edge an edge roughness that is outside a predefined error interval (not represented in FIG. 9). The production of a corresponding repair shape for removing the defect 940 extending along the pattern element 930 is therefore a very complex and time-consuming process.

Figure 10:
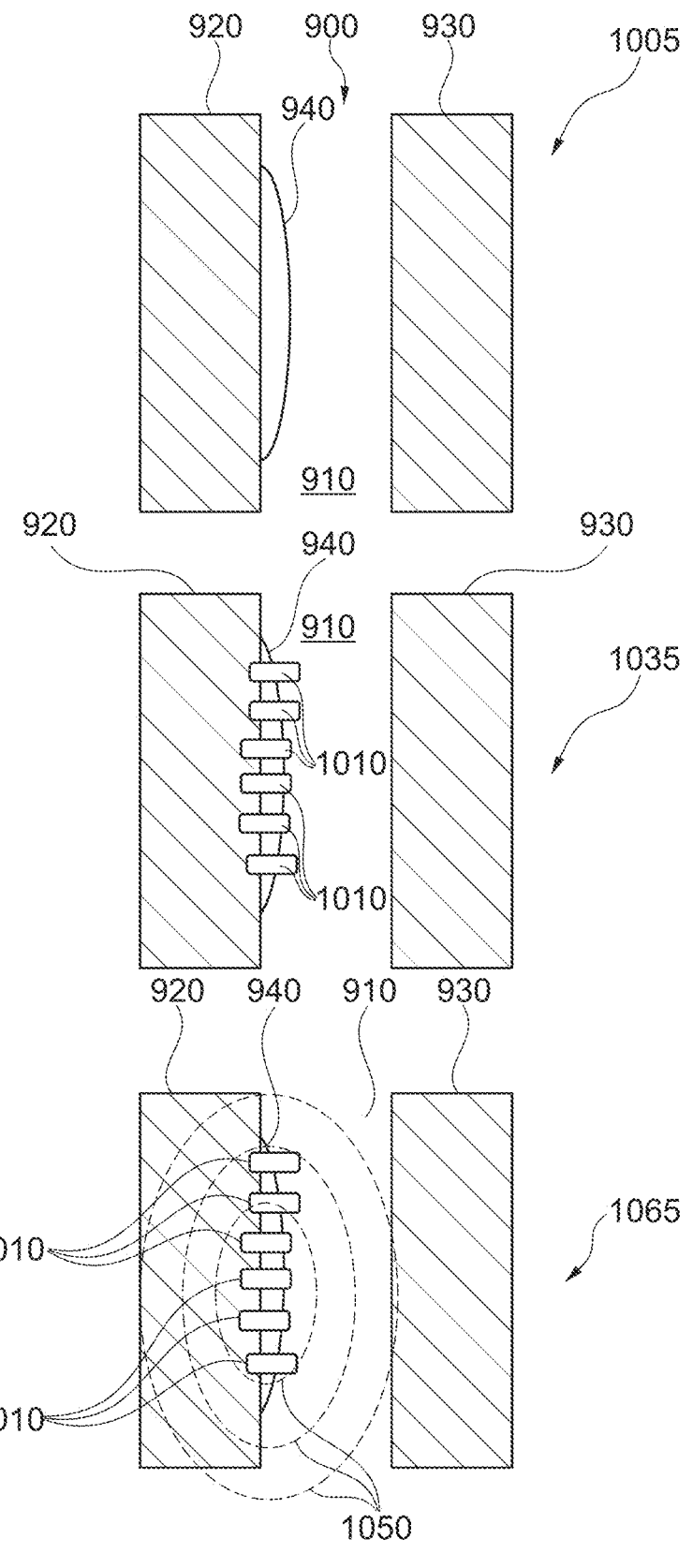
FIG. 10 in the upper partial image reproduces the upper partial image from FIG. 9, in the central partial image illustrates an exemplary repair of the defect from the upper partial image in accordance with one of the methods described in this application, and in the lower partial image illustrates the averaging of the complex amplitude of the actinic radiation on a length scale of the optical resolution.

FIG. 10 illustrates the repair of the 2D defect 940 from FIG. 9 with the aid of one of the methods presented in this application. The upper partial image 1005 in FIG. 10 reproduces again the upper partial image 905 from FIG. 9. The central partial image 1035 in FIG. 10 illustrates the compensation of the defect 940 of excess material by the generation of the repair elements 1010. The repair elements 1010 produced local etched structures in the defect 940, partly in the substrate 910 of the mask 900 and partly also in the pattern element 920. The various repair elements 1010 can be produced on the basis of a single repair shape produced at various positions along the defect extending at the right edge of the pattern element. However, it is also possible to ascertain a single repair shape, which produces the various repair elements 1010, as illustrated in the central partial image 1035 in FIG. 10.

The great advantage of the repair of the defect 940 as represented in the partial image 1035 is the significantly reduced sensitivity of the placement or the positioning of the repair elements 1010 in relation to the defect 940. The lower partial image 1065 in FIG. 10 schematically illustrates the reduced sensitivity during placement of the repair elements 1010. The dashed ellipses 1050 illustrate the area region of a photolithographic mask 900 or the length scale over which the mask 900 subjects the complex amplitude of the actinic electromagnetic radiation to averaging. If on a photomask there are structures present whose dimensional sizes in one or two dimensions are smaller than the resolution limit of the photomask, the actinic radiation averages across the details of said structures. This means that the microroughness of pattern elements does not influence, or scarcely influences, the imaging behavior of the photolithographic mask, whereas the complex amplitude of the electromagnetic actinic radiation averaged over a dimensional size in the region of the resolution limit influences the imaging behavior of the photomask.

The dashed ellipses 1050 show the regions of a mask which contribute optical intensity portions to a point of an imaging of the mask in a photoresist. The scale of this averaging region is determined—as already explained above—by the resolution limit $R_M$ of the photolithographic mask. As long as the dimensional sizes of the repair elements 1010 are small relative to the resolution limit $R_M$, the size and placement thereof are less sensitive by up to the factor $1/R_M$ compared with both the size and the positioning of repair elements from the prior art. This means that a very large range of different repair elements 1010 leads to the same or a very similar result with regard to the imaging behavior of a photolithographic mask. The methods described in this application make use of this circumstance in order to improve the repair of small defects that hitherto had been particularly difficult to repair.

The resolution limits of present-day DUV and EUV masks are indicated above.

Figure 11:
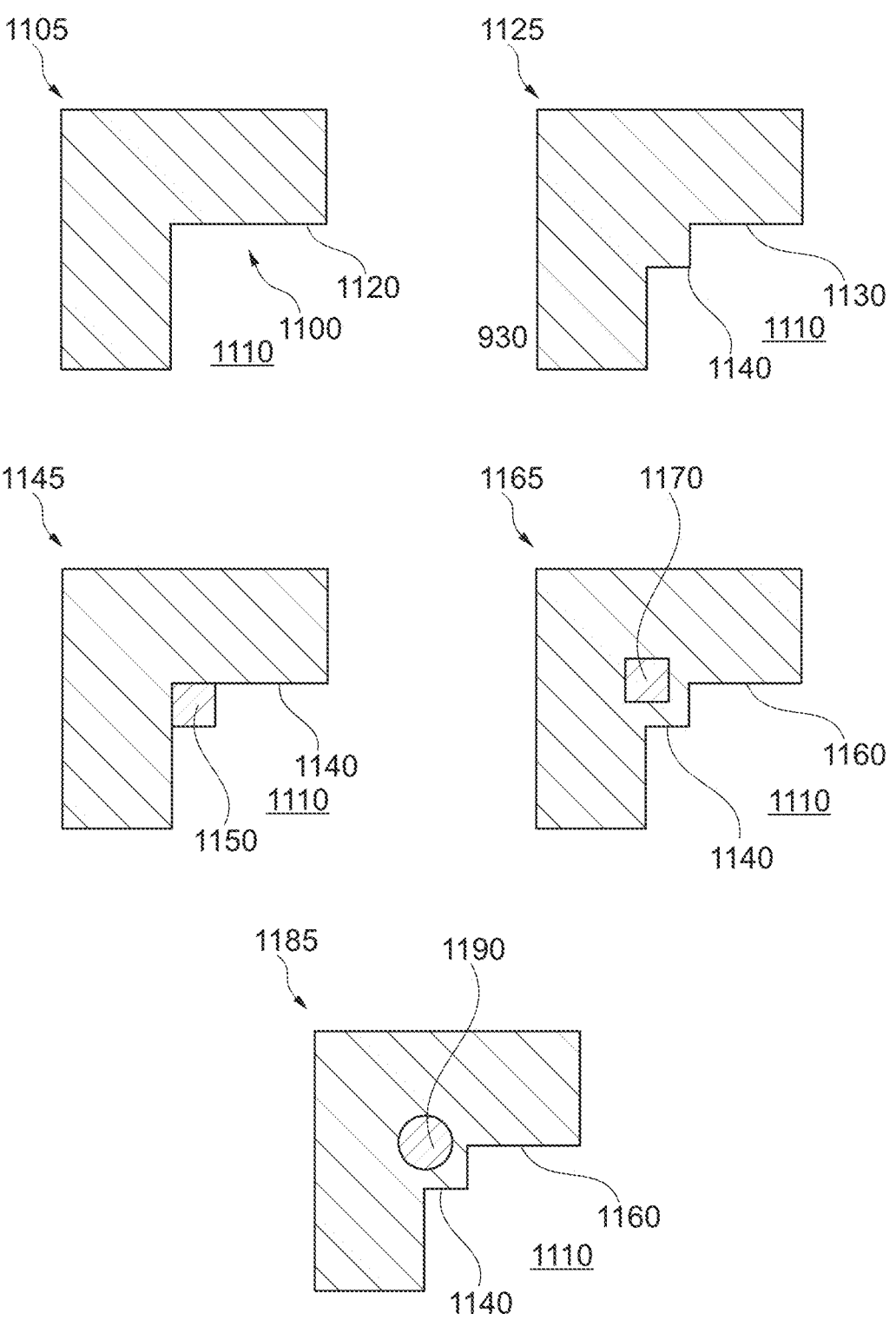
FIG. 11 in the upper partial image 1105 schematically illustrates a plan view of an absorbing, angular pattern element, in the partial image 1125 represents a pattern element having a defect of excess absorber material, in the partial image 1145 represents the repair of the defect from the partial image 1125 in accordance with the prior art, in the partial image 1165 illustrates the compensation of the defect from the partial image 1125 by production of a repair element described in this application, and in the partial image 1185 illustrates the generation of a second example of a repair element according to the invention.

FIGS. 11 and 12 explain the repair of a defect of excess absorber material and missing absorber material, wherein the repair element can have a different geometric shape from the defect to be repaired. The partial image 1105 shows a mask segment 1100 with an angular pattern element 1120, which is arranged on a mask substrate 1110, and the shape of which fulfils the design specifications. In the partial image 1125 in FIG. 11, the pattern element 1130 has a defect 1140 of excess absorber material, this defect being located at the inner side of the angular region of the pattern element 1130.

The partial image 1145 in FIG. 11 presents the repair of the defect by the implementation of a repair shape assigned to the defect in accordance with the prior art, which repair shape produces the repair element 1150 in the region of the defect 1140. The problem associated with this has already been thoroughly explained above in the context of FIGS. 3 and 9.

The partial image 1165 in FIG. 11 illustrates a first example of the production of a repair element 1170, which compensates for the defect 1140, and which is much less sensitive than the repair element 1150 from the partial image 1145 both with regard to firstly the placement of the repair element 1170 relative to the defect 1140 and with regard to secondly the lateral dimensional sizes of the repair element 1170 in relation to the dimensional sizes of the defect 1140. Finally, the partial image 1185 represents a repair element 1190, the geometric shape of which is distinctly different from the shape of the defect to be repaired. A circular or circle-like repair element 1190 is able to be generated significantly more simply than a rectangular or square repair element 1170. The repair element 1190 in the partial image 1185 nevertheless brings about a compensation of the defect 1140 that is in no way inferior to the compensation of the repair element 1170. The reasons for this have been explained in the discussion of FIG. 10.

The repair of a defect of missing absorber material will now be described with reference to FIG. 12. The partial image 1205 in FIG. 12 shows a square pattern element 1220 placed on an optically transparent substrate 1210 of a photolithographic mask 1200. In the pattern element 1230 in the partial image 1225, a part 1240 of the pattern element 1230 is missing. This means that the latter has a clear defect 1240 or a defect 1240 of missing absorbing material.

The partial image 1245 in FIG. 12 illustrates the repair of the defect 1240 of missing material by applying a corresponding repair element 1250 over the defect 1240 by implementing the repair shape ascertained for the defect. The repair element 1250 is implemented in accordance with the prior art.

The partial image 1265 in FIG. 12 shows a first example of a repair element 1270, which was produced in accordance with one of the methods described in this application, and which avoids the sensitivity of the repair method in the partial image 1245. Furthermore, the repair element 1290 illustrates a second exemplary embodiment of a repair element 1290, which only partly reproduces the complicated contour of the defect 1240, and is therefore able to be produced even more simply than the repair element 1270.

Figure 13:
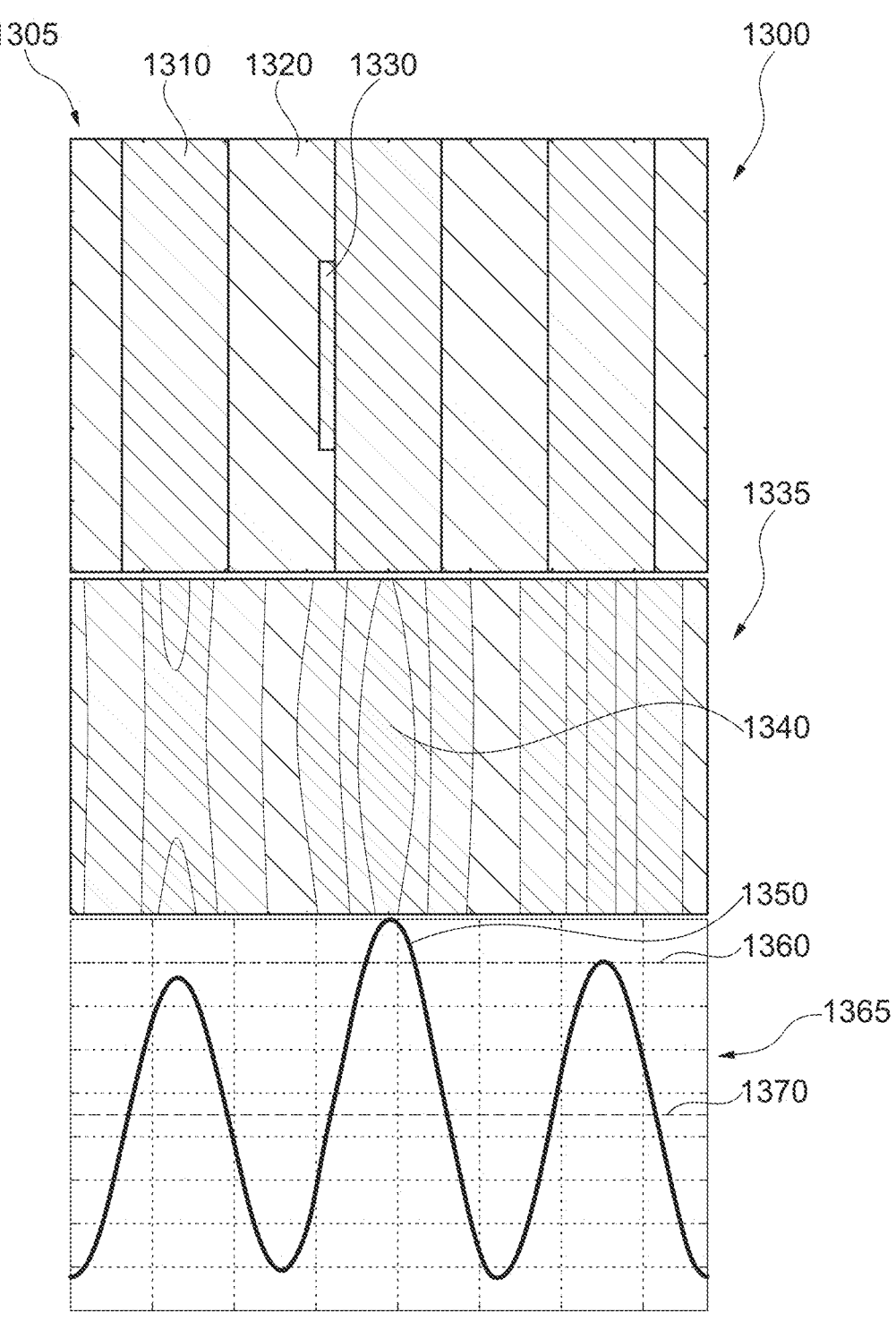
FIG. 13 in the upper partial image 1305 represents a strip structure of a mask arranged on a substrate, wherein a pattern element has a defect of missing absorber material, the central partial image 1335 illustrates a rigorous simulation of the defective mask segment, and the lower partial image 1365 shows the optical intensity distribution of the defective mask segment.

FIG. 13 presents in the upper partial image 1305 a plan view of a mask segment 1300 having a strip structure with absorbing strip-shaped pattern elements 1320 applied on a substrate 1310 of the photomask 1300. The second pattern element 1320 from the left has a defect 1330 of missing material. The width of the defect 1330 was chosen as 15% of the half-pitch of the strip structure. The central partial image 1335 in FIG. 13 presents a rigorous simulation of the imaging behavior of the mask segment 1300 from the upper partial image 1305. The defect 1330 is clearly visible as defect 1340 in the central partial image 1335.

The lower partial image 1365 in FIG. 13 represents the optical intensity distribution of the defective mask segment 1300. The dashed horizontal line 1360 indicates the maximum of the optical intensity distribution or the effective dose distribution of an error-free mask segment. The points of intersection between the intensity distribution and the dashed horizontal line 1370 describe the points at which a photoresist is deemed to be exposed. Said points of intersection thus represent the width of the strip-shaped pattern element produced on a wafer by the mask segment 1300. The defect 1330 is mirrored in a wider central pattern element produced on a wafer. A variation of the width of the pattern element imaged in a photoresist by the mask segment 1300 results in a variation of the CD (Critical Dimension) along the imaged pattern structure.

Figure 14:
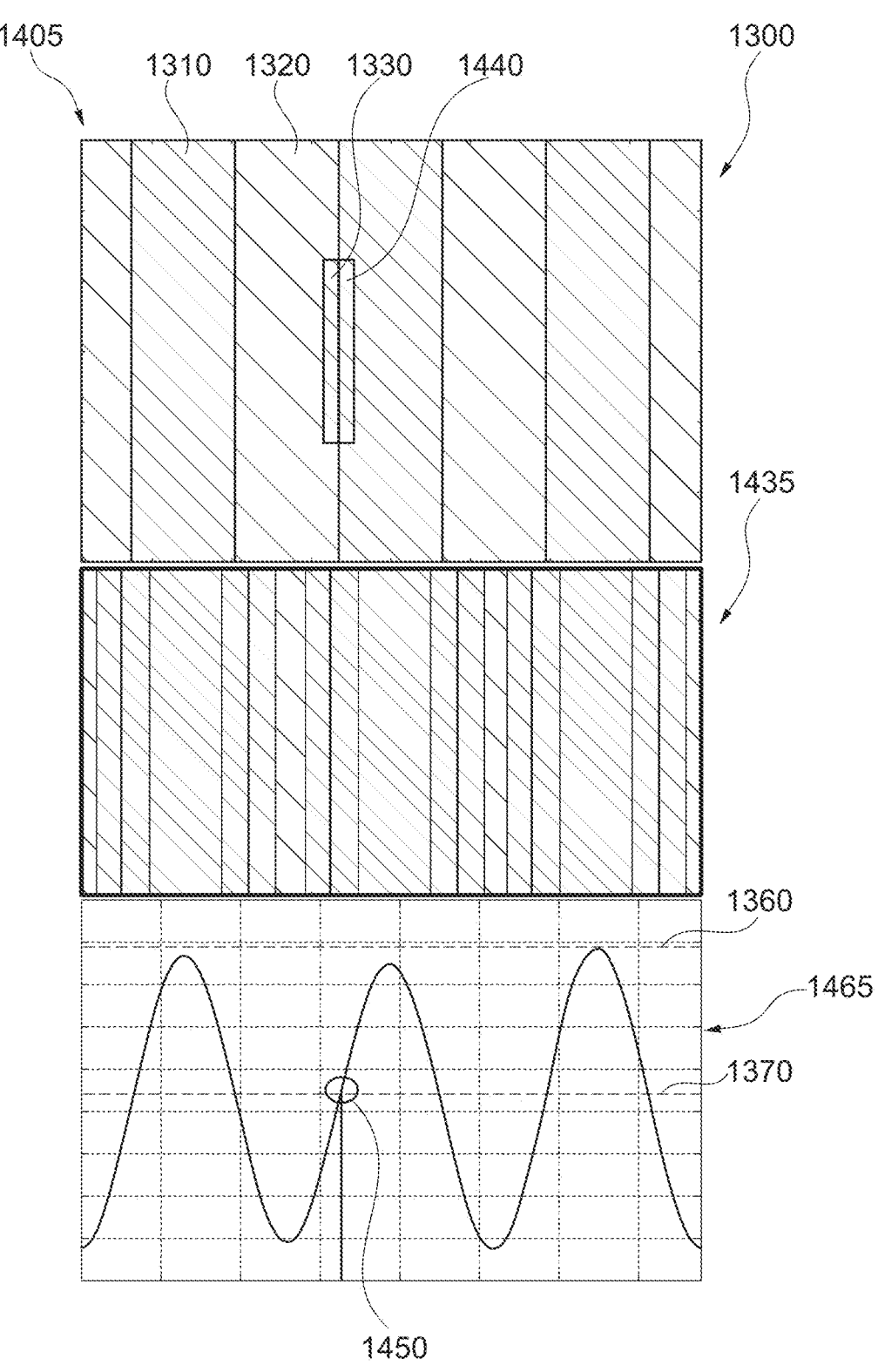
FIG. 14 illustrates the mask segment from FIG. 13 after an optimum repair of the defect by a method according to the invention.

FIG. 14 represents in the upper partial image 1405 the defective mask segment 1300 for the repair of the defect 1330 by the production of a repair element 1440. In the example illustrated in FIG. 14, the repair element 1440 was not placed on the defect 1330, as usual in the prior art, but rather was positioned directly next to the defect 1330 of missing absorber material. As can be gathered from the central partial image 1435, the repaired defect 1330 is no longer visible in the imaging simulation. In addition, it is clearly evident from the lower partial image 1465 that the repair element 1440 repairs the defect 1330 perfectly, and so there is no variation of the optical intensity over the length of the pattern elements 1320.

Figure 15:
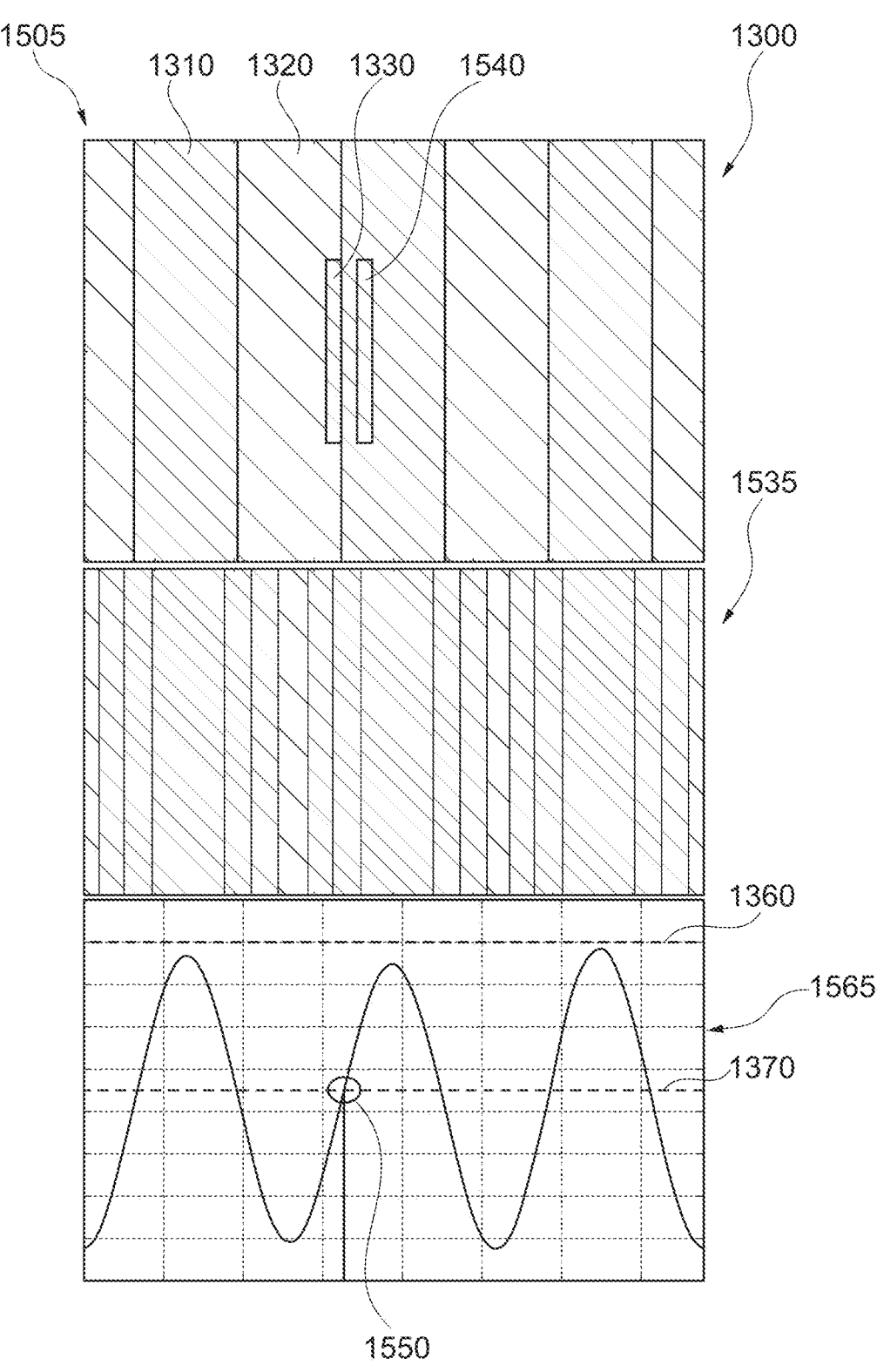
FIG. 15 represents the mask segment from FIG. 13 after a repair of the defect from FIG. 13 with a repair element which was not optimally positioned.

FIG. 15 illustrates in the upper partial image 1505 a repair of the defect 1330 from FIG. 13, during which repair the repair element 1540 was placed at a distance of 15% of the half-pitch from the pattern element 1320. No deviation from a defect-free mask structure is discernible in the imaging simulation illustrated in the central partial image 1535 in FIG. 15. A slight reduction of the maximum of the optical intensity distribution is visible in the lower partial image 1565 in FIG. 15, and results in a smaller width of the central pattern element in a wafer. However, the deviation of the width is still within the error budget predefined for the mask 1300.

Figure 16:
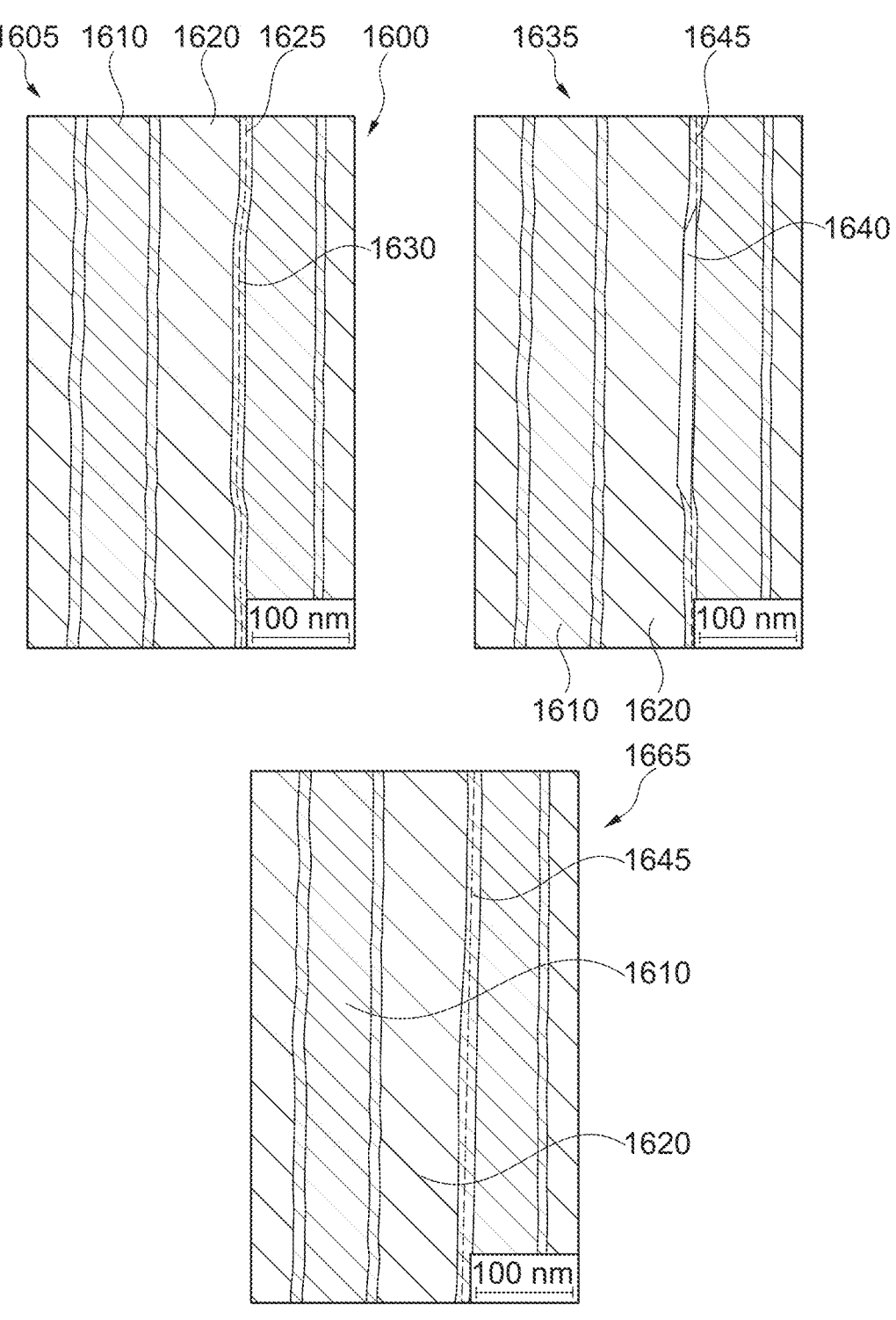
FIG. 16 in the top left partial image 1605 illustrates a mask segment having a defect, said mask segment being measured by a scanning electron microscope, in the top right partial image 1635 represents a repair element in the mask segment from the top left partial image, which repair element compensates for the defect, and in the bottom left partial image 1665 presents the repaired mask segment from the top left partial image 1605.

The top left partial image in FIG. 16 shows a mask segment 1600 recorded by a scanning electron microscope, said mask segment having a strip pattern (lines & space pattern) with a half-pitch of 152 nm on the mask 1600. As indicated by the dashed vertical line 1625 having a bend, a pattern element 1620 of the mask segment 1600 has a defect 1630 of missing absorbing material. The exemplary defect 1630 in FIG. 16 has an extent in the region of 10 nm perpendicular to the pattern element 1620. This extent is significantly smaller than the resolution limit $R_M$ of the photolithographic mask 1600.

The repair element 1640 is depicted schematically in the top right partial image 1635, said repair element being designed such that in combination with the adjacent pattern elements 1620 it compensates for the defect 1630. The bottom left partial image 1665 in FIG. 16 represents the repaired mask segment from the top left partial image 1605 as a difference image with respect to the top right partial image 1635. As indicated by the straight vertical line 1645, the defect 1630 is no longer visible in the recording of the mask segment 1600.

Figure 17:
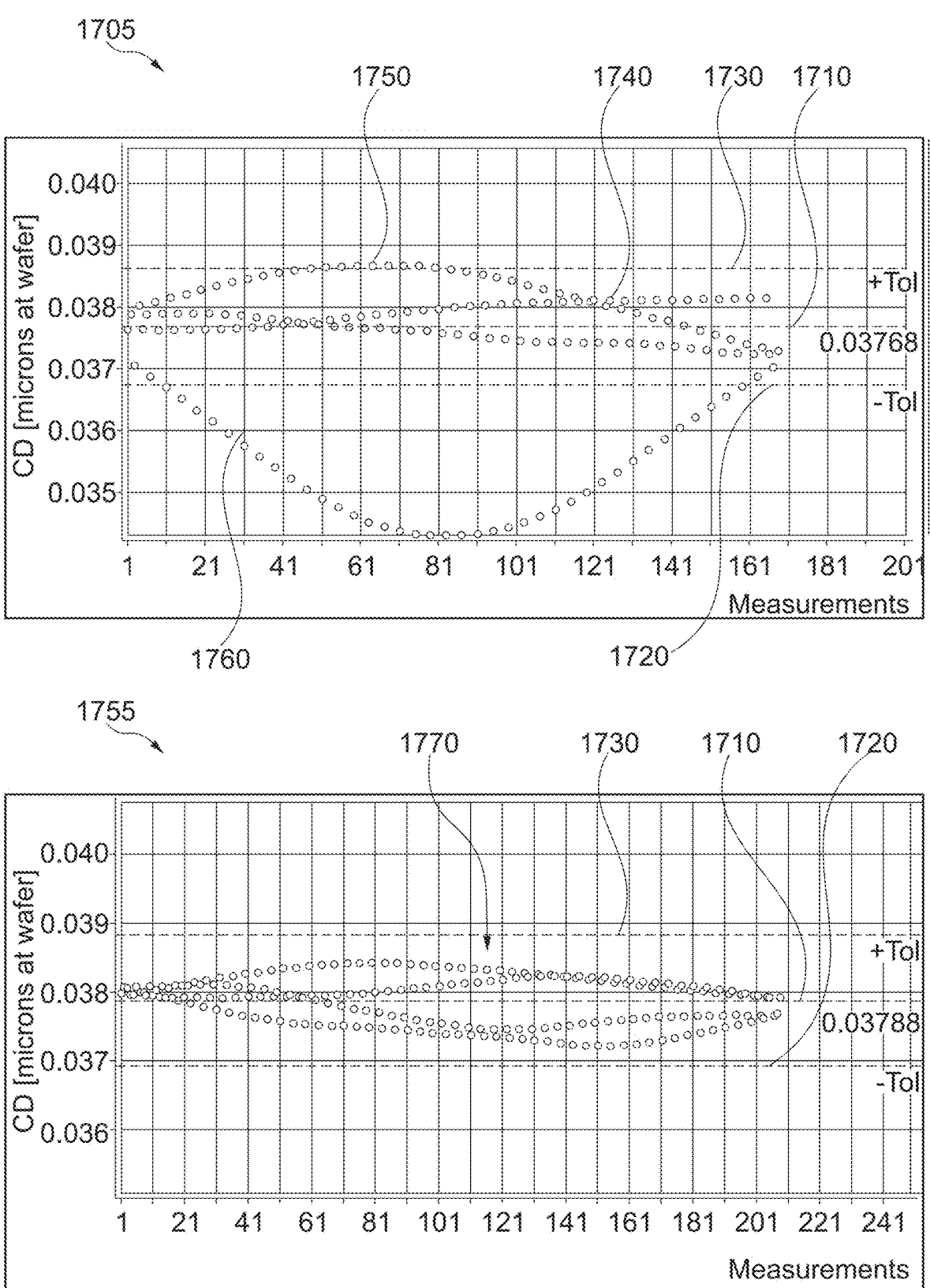
FIG. 17 in the upper partial image 1705 represents the normalized CD variation within the defective mask segment from the top left partial image in FIG. 16, and in the lower partial image 1755 illustrates the normalized CD variation of the repaired mask segment from the bottom left partial image 1665 in FIG. 16.

The upper partial image 1705 in FIG. 17 shows the variation of the CD for the various pattern elements from the top left partial image 1605 in FIG. 16 along the pattern elements. The dashed line 1710 specifies the CD—predefined by the design—of a pattern element produced on a wafer by use of the mask 1600; in the example illustrated in FIG. 17, said CD is: CD=37.68 nm. The dashed horizontal lines 1720 and 1730 represent the lower limit and upper limit, respectively, of the permissible CD variation (ΔCD). The CD variation range ΔCD is ±2.5% in the example in FIG. 17. The curves in the upper partial image 1705 reveal that the curve 1750 touches the upper limit of the CD tolerance interval and the CD curve 1760 progresses far outside the CD tolerance interval of ±2.5% over the majority of its profile. The maximum of the normalized CD variation for the curve 1760 is: ΔCD/CD=8.6%.

The lower partial image 1755 in FIG. 17 presents the CD variation for the various pattern elements 1620 of the repaired mask segment from the bottom left partial image 1665 in FIG. 16. All the CD curve profiles lie within the permissible tolerance interval, that is to say that all the CD curves satisfy the requirement: ΔCD/CD<±2.5%. This means that the repair element 1640 completely compensates for the defect 1630.

Figure 18:
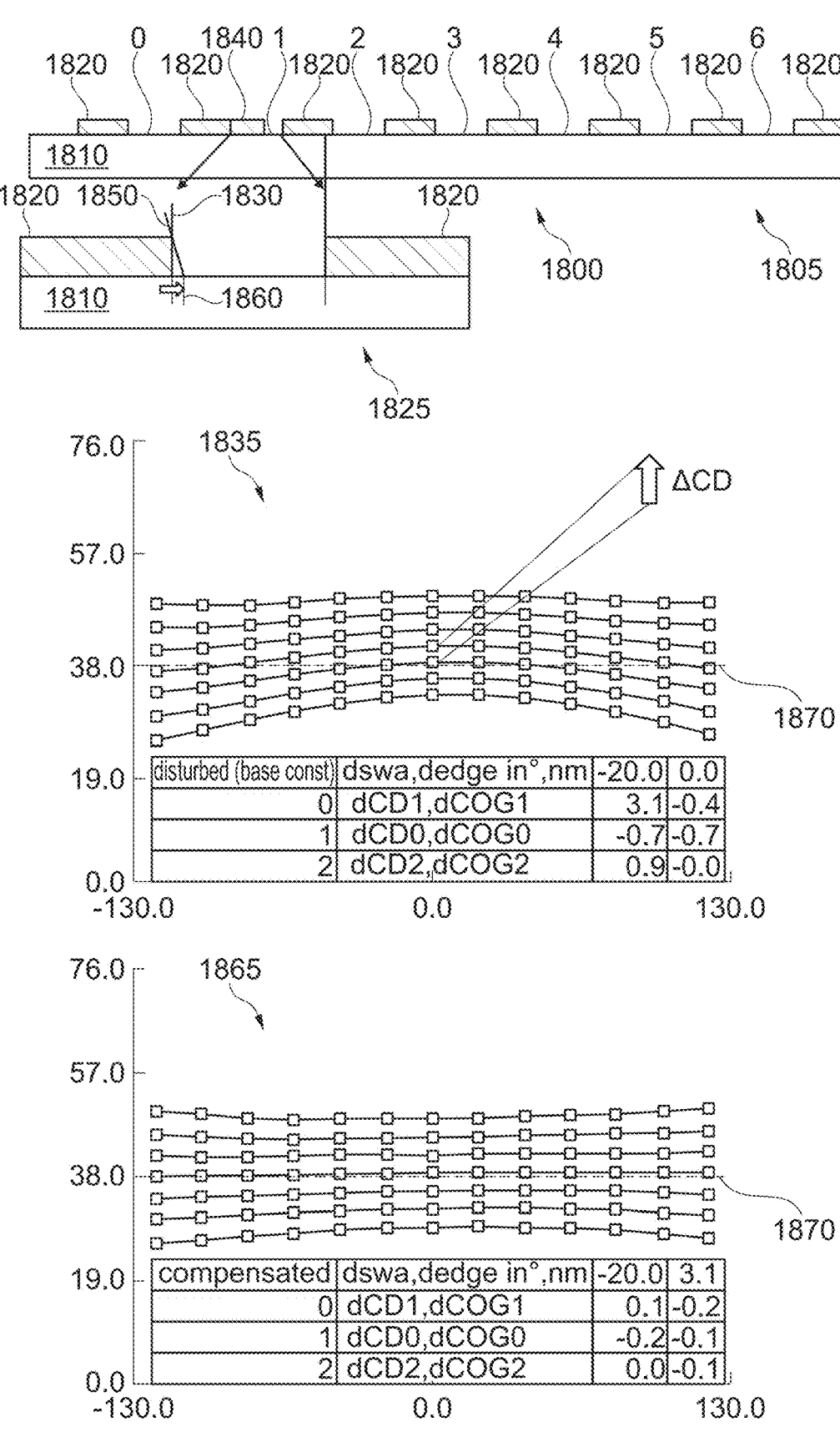
FIG. 18 in the upper partial image 1805 represents a schematic section through a strip structure with a defect, in the partial image 1825 illustrates the mask segment from the partial image 1805 around the repaired defect, in the partial image 1835 illustrates the CD variation caused by the defect from the upper partial image, and in the lower partial image 1865 presents the CD variation that still remains after the defect repair.

The upper partial image 1805 in FIG. 18 shows a 1D section through a mask segment 1800 with eight pattern elements 1820 in the form of a strip structure, which are arranged on an optically transparent substrate 1810 of the mask 1800. The eight pattern elements 1820 generate seven optically transparent strips, numbered consecutively from 0 to 6 in the partial image 1805. The half-pitch of the strip structure on the mask 1800 is 152 nm or 38 nm on a wafer. In the upper partial image 1805, the second pattern element 1820 from the left has at its right edge a defect 1840 of excess, absorbing and phase shifting molybdenum silicide (MoSi) material. In order to analyze the effect of the defect 1840, the strip structure of the defective mask segment 1800 represented in the partial image 1805 is simulated. The simulation parameters are: NA=1.35, λ=193 nm, outer σ value: 1.0, inner σ value: 0.88, exposure setting: Disar, polarization: y-direction, pattern: L&S (lines & space) MoSi with 6% absorption at the actinic wavelength. The electromagnetic radiation incident on the mask 1800 is assumed to be coherent.

The central partial image 1835 in FIG. 18 presents the variation of the CD for the seven optically transparent strips 0 to 6 along the strip direction, i.e. perpendicular to the plane of the drawing, in a simulation. In addition, the shift of the center of gravity (CoG) of the optical intensity distribution is ascertained with the aid of the simulation. The dashed horizontal line 1870 represents the target CD predefined for the mask 1800. The curves in the central partial image 1835 describe the variation of the critical dimension, i.e. ΔCD, along the pattern elements 1820. The table in the central partial image 1835 summarizes the ΔCD and ΔCoG for the optically transparent strips 0, 1 and 2. The table shows that the variation of the CD for the zeroth strip is 3.1 nm, and is thus significantly greater than the error budget of the mask 1800 of 2.5%. The effect of the defect 1840 on the second optically transparent strip is a consequence of the exposure of the mask 1800 with coherent radiation. The simulation was carried out by use of the rigorous optical imaging program Dr. Litho from the Fraunhofer Institute for Integrated Device Technology (IISB) Erlangen.

The enlarged segment 1825 shows the pattern elements 1820 around the defective transparent strip 1 after the repair of the defect 1840 by implementing the corresponding repair shape ascertained for the defect. When implementing the repair shape for local etching of the defect 1840 it is assumed that the local etching process produces a sidewall angle 1850 with a negative angle of −20°. The negative sidewall angle 1860 causes an amplitude defect in an aerial image or during the exposure of a wafer. It is taken into account by a magnification factor MEEF=1.4. The negative sidewall angle 1850 is compensated for by a (positive) shift of the base point 1860 of the edge 1830, such that the breadth or width of the strip 1 corresponds approximately to half the magnitude of the nominal width of the optically transparent strip. Errors of the sidewall angle, for an angular range of approximately ±20°, can be substantially completely compensated for by use of a corresponding shift of the base point of the edge 1830 of the repaired pattern element 1820. The lateral shift required for this is in a range of approximately ±3.3 nm for λ=193 nm.

The lower partial image 1865 indicates the simulated variation of the CD for the optically transparent strips 0 to 6 along the strip direction. Furthermore, the CoG shift of the optical intensity distribution is determined with the aid of the simulation. The dashed horizontal line 1870 describes the target value of the CD on a wafer. It is immediately evident from a comparison of the sets of curves in the partial images 1835 and 1865 that the repair of the defect 1840 drastically reduces the CD variation. The table in the lower partial image 1865—in a similar manner to the table in the central partial image 1865—summarizes the ΔCD and ΔCoG for the optically transparent strips 0, 1 and 2. In comparison with the table in the central partial image 1835, the repair of the defect 1840 has reduced the CD variation by more than one order of magnitude.

The repair of a defect 1840 of excess material has been discussed in association with FIG. 18, said defect adjoining the edge 1830 of a pattern element 1820 without completely covering the transparent strip. It goes without saying that it is also possible to repair a defect of excess material that completely bridges two pattern elements. Furthermore, the method explained in the context of FIG. 18 can also be used for repairing defects of missing material.

The flow diagram 1900 in FIG. 19 describes a first exemplary embodiment of the method discussed in this application for repairing at least one defect 240, 750, 940, 1140, 1240, 1330, 1630, 1840 of a lithographic mask 200, 400, 500, 600, 700, 800, 900, 1100, 1200, 1300, 1600, 1800. The method begins in step 1910. In the next step 1920, parameters of at least one repair shape for the at least one defect 240, 750, 940, 1140, 1240, 1330, 1630, 1840 are ascertained, wherein ascertaining parameters comprises: allocating to at least one corresponding parameter a numerical value that deviates from the numerical value predefined by the at least one defect 240, 750, 940, 1140, 1240, 1330, 1630, 1840. The method ends in step 1930.

Furthermore, the flowchart 2000 in FIG. 20 presents the steps of a second exemplary embodiment of the method for repairing at least one defective pattern element 220, 740, 840, 860, 920, 1130, 1230, 1320, 1620, 1820 of a lithographic mask 200, 400, 500, 600, 700, 800, 900, 1000, 1100, 1200, 1300, 1600, 1800. The method begins in step 2010. In the next step 2020, at least one repair element 410, 510, 610, 770, 790, 850, 870, 1010, 1170, 1190, 1270, 1290, 1440, 1540, 1640 of the lithographic mask which does not image the lithographic mask during the exposure thereof is determined, wherein the repair element changes an imaging behavior of the at least one defective pattern element.

Then, in step 2030, at least one repair element is produced on the lithographic mask by use of a focused particle beam and at least one precursor gas. The method ends in step 2040.

Figure 21:
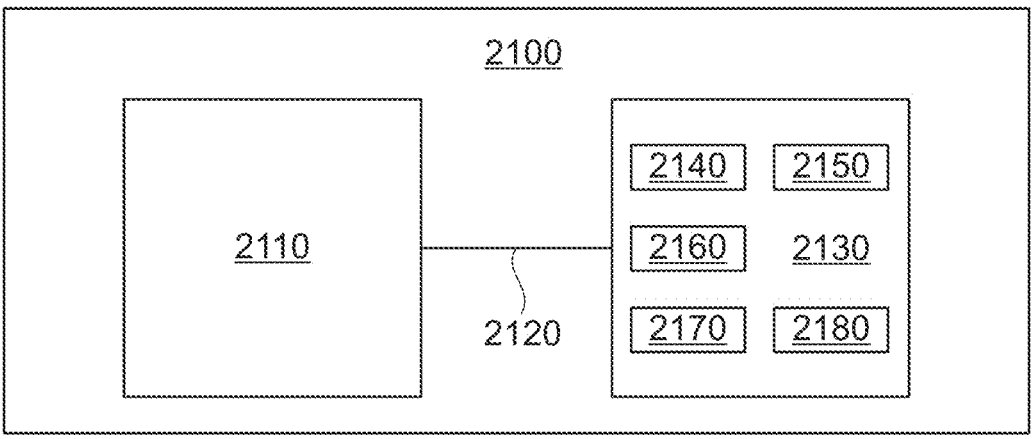
FIG. 21 presents a schematic section through an apparatus for repairing one or more defects of a lithographic mask.
Figure 22:
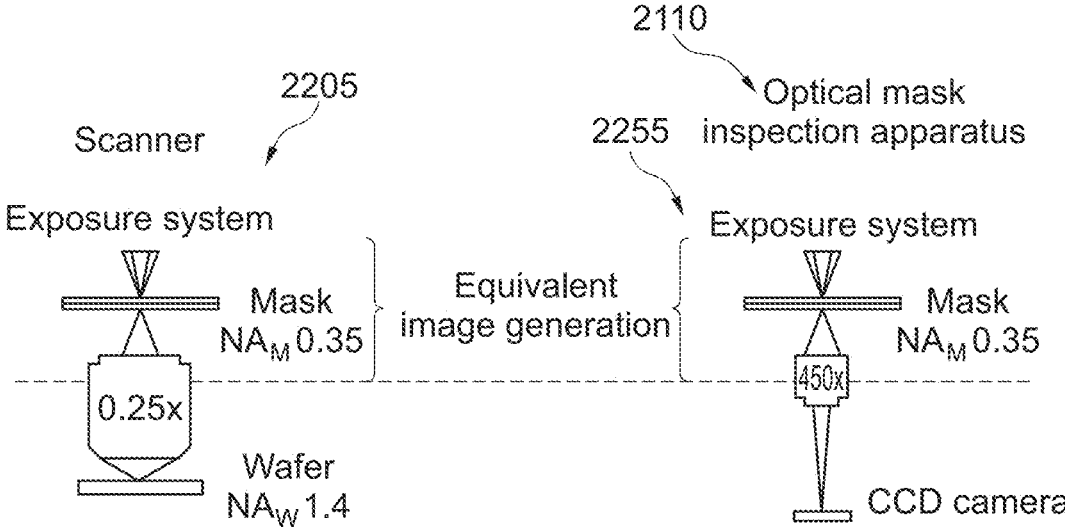
FIG. 22 illustrates a schematic section through an optical mask inspection apparatus and a comparison with a scanner of a photolithographic exposure system.

FIG. 21 schematically shows a section through an apparatus 2100 designed for ascertaining parameters for a repair shape for at least one defect 240. For this purpose, the apparatus 2100 comprises an optical mask inspection apparatus 2110. FIG. 22 illustrates the principle of an optical mask inspection apparatus designed for recording an aerial image of a transmissive mask 200. Some components of a scanner are illustrated schematically in the left partial image 2205 in FIG. 22. An exposure system focuses electromagnetic radiation of the actinic wavelength onto a photolithographic mask. A projection optical unit or a projection lens images the radiation passing through the photomask with reduction (typically 1:4 or 1:5) on a wafer or on a photoresist distributed on the wafer with a large numerical aperture ($NA_W$).

The right partial image 2255 in FIG. 22 shows some components of an optical mask inspection apparatus 2110 designed for the actinic wavelength of the scanner from the left partial image 2205. The exposure system of the scanner and of an optical mask inspection apparatus 2110 are substantially identical. This means that the image generation is substantially the same for both systems. The optical mask inspection apparatus 2110 thus images a segment of the optical intensity distribution of a mask such as is incident on a photoresist arranged on the wafer. Unlike in the case of a scanner, however, in the case of an optical mask inspection apparatus 2110 a lens images a small segment of the optical intensity distribution of a photomask with great magnification on a CCD (Charge-Coupled Device) camera. As a result, it becomes possible to represent defects which a photomask has at the actinic wavelength in its aerial image and to detect said defects with the aid of a CCD sensor or a CCD camera.

The optical mask inspection apparatus 2110 of the apparatus 2100 can provide the measurement data of one or more aerial images to a computer system 2130 of the apparatus

2100 via the connection 2120. The computer system 2130 of the apparatus 2100 can ascertain the parameters of a repair shape assigned to the defect of the aerial image from the measurement data of the aerial image(s). For this purpose, the computer system 2130 can comprise a coprocessor 2140 specifically designed to efficiently execute an algorithm that determines the parameters of a repair shape assigned to the defect from the aerial image(s) of the optical mask inspection apparatus. Furthermore, the computer system 2130 of the apparatus 2100 can have a second algorithm designed to allocate to one or more parameters of the repair shape a value or a numerical value that deviates from the numerical value predefined by the defect. The second algorithm can likewise be executed by the coprocessor 2140.

However, it is also possible for the computer system 2130 to have a dedicated hardware component 2150 that executes one or both of the algorithms described above. The hardware component 2150 of the computer system can be implemented in the form of an ASIC (Application Specific Integrated Circuit), a complex programmable logic circuit (CPLD, Complex Programmable Logic Device) and/or a field programmable gate array (FPGA).

Additionally or alternatively, the computer system 2130 can comprise a dedicated graphics processor 2160 designed to implement a trained machine learning model. A machine learning model can be trained in at least two ways, or the graphics processor can implement two different trained machine learning models designed for the respective problem formulated. Firstly, a machine learning model can be trained to ascertain from the measurement data of the optical mask inspection apparatus 2110, from design data of the lithographic mask 200, settings of the exposure system and optionally of RET structures produced on the mask 200 the parameters of one or more repair shapes implemented in order to repair or to compensate for the defect(s), i.e. in order to generate one or more repair elements 410, 510, 610.

Alternatively or additionally, a machine learning model, for a repair shape that has already been parametrized, can allocate a different numerical value to one or more parameters for the purpose of ascertaining the above-described repair elements 410, 510, 610 according to the invention. The currently preferred embodiment, however, is that, from the input data indicated above, a machine learning model directly predicts the parameters of a repair shape for the purpose of forming one of the repair elements 410, 510, 610 described in this application. The process of training a machine learning model will not be discussed in this application.

Furthermore, the computer system 2130 can comprise a non-volatile memory 2170, in which the algorithm(s), the machine learning model(s), and/or the trained machine learning model(s) are/is stored. The non-volatile memory 2170 can comprise a solid state memory (SSD, Solid State Drive).

Furthermore, the computer system 2130 can comprise a control device 2180 designed for controlling the optical mask inspection apparatus 2110.

Furthermore, the apparatus 2100 can comprise a scanning particle microscope, a scanning probe microscope, and/or a confocal microscope, which are designed to scan a defect 240 of a photolithographic mask 200 and to generate a pictorial representation of the measurement data. If the apparatus 2100 comprises one or more of these measuring instruments, the control device 2180 can likewise control these measuring devices.

Figure 23:
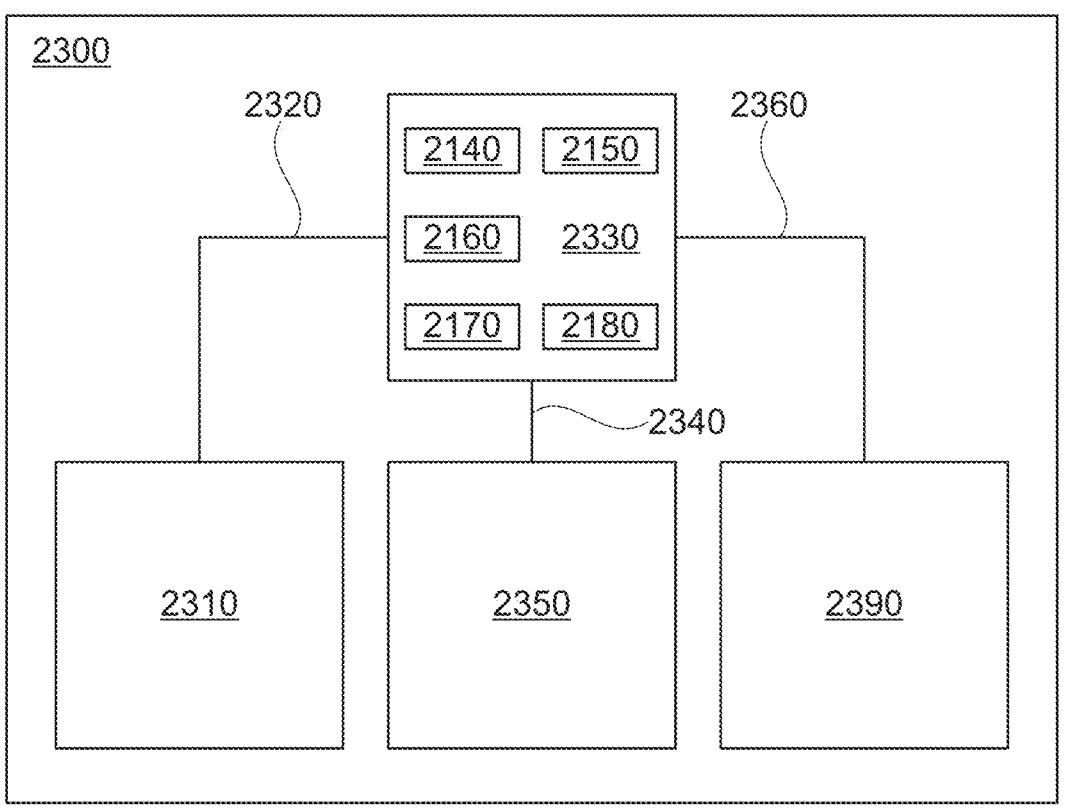
FIG. 23 presents a schematic section through an apparatus for repairing at least one defective pattern element of a lithographic mask.

FIG. 23 schematically presents a section through an apparatus 2300 that can repair at least one defective pattern element 220. For this purpose, the apparatus 2300 comprises an optical mask inspection apparatus 2310. This type of measuring instruments has already been described above in the context of the discussion of FIG. 22.

The optical mask inspection apparatus 2310 of the apparatus 2300 can provide the measurement data of one or more aerial images or of an aerial image stack to a computer system 2330 of the apparatus 2300 via the connection 2320. The computer system 2330 of the apparatus 2300 can be similar to the computer system 2130 of the apparatus 2100 from FIG. 21. In order to avoid long drawn-out passages, a description of the computer system 2330 will be dispensed with. Rather, reference is made to the discussion of FIG. 21.

The apparatus 2300 furthermore comprises a particle beam source 2350, which can provide a focused particle beam. The focused particle beam of the particle beam source 2350 can be used firstly for analyzing a defect 240 of a photolithographic mask 200. On the basis of the measurement data of the focused particle beam and/or the measurement data of the optical mask inspection apparatus 2310, a repair shape for the defect can be determined with the aid of one or more algorithms or one or more machine learning models. Secondly, the focused particle beam of the particle beam source 2350 in combination with the gas providing system 2390 of the apparatus 2300 can be used for repairing the analyzed defect 240. Both the particle beam source 2350 and the gas providing system 2390 can exchange data with the computer system 2330 via the connections 2340 and 2360. Furthermore, the control unit 2180 of the computer system 2330 can control the optical mask inspection apparatus 2310, the particle beam source 2350 and the gas providing system 2390.

Figure 24:
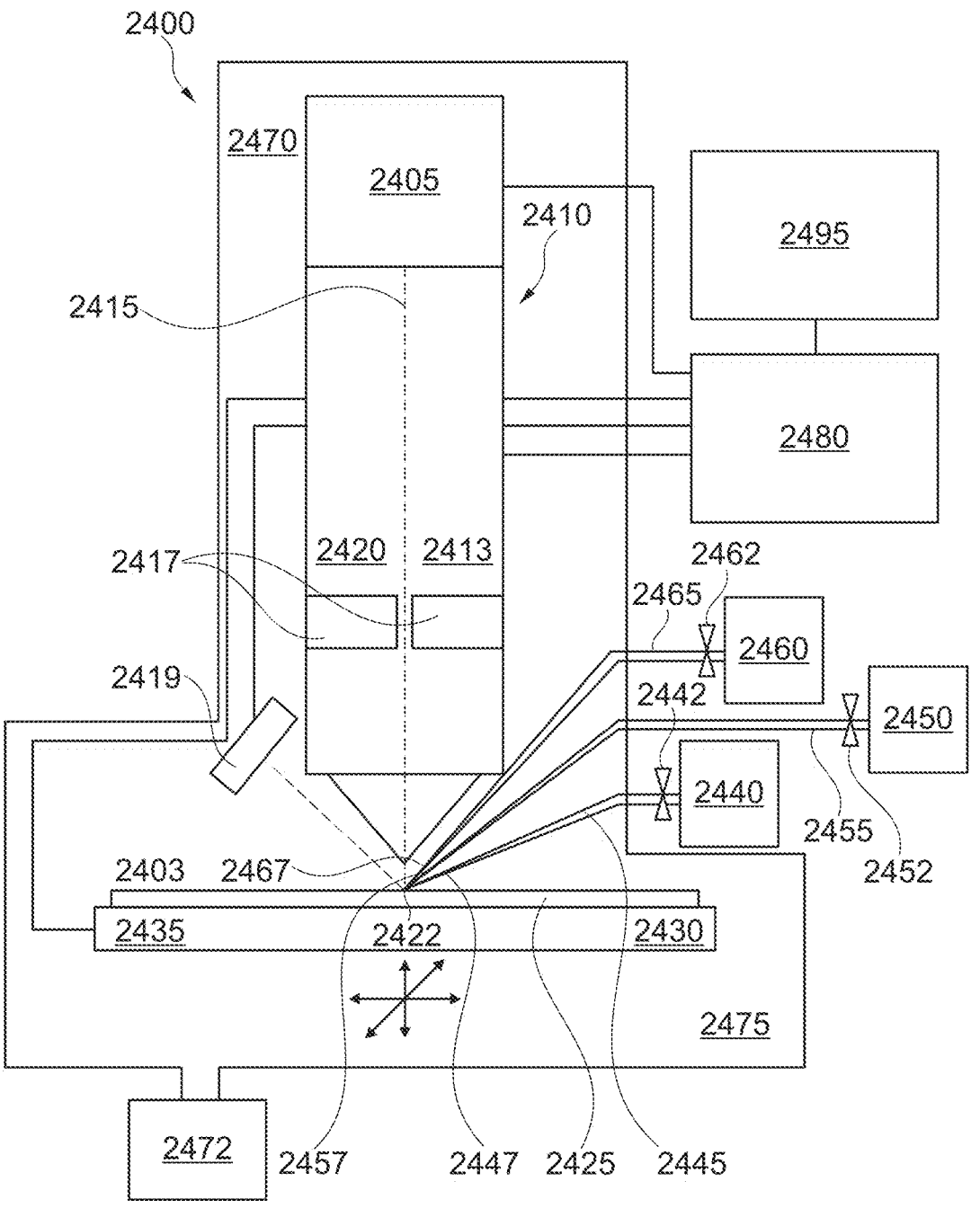
FIG. 24 illustrates a schematic section through an apparatus that realizes a particle beam source and a gas providing system from FIG. 23.

FIG. 24 shows a schematic section through an apparatus 2400 that combines a particle beam source 2350 and a gas providing system 2390 of the apparatus 2300. A repair element 410, 510, 610 for repairing the defect 240 can be produced by the apparatus 2400. The exemplary apparatus 2400 in FIG. 24 comprises a modified scanning particle microscope 2410 in the form of a scanning electron microscope (SEM) 2410. The apparatus 2400 comprises a particle beam source 2350 in the form of an electron beam source 2405, which generates an electron beam 2415 as a particle beam having mass 2415. An electron beam 2415 can be focused to a spot that is significantly smaller than the focus diameter of a photon beam. On account of the small de Broglie wavelength of electrons, the electron beam 2415 can be focused to a spot diameter in the range of a few nanometers. As an analysis or measurement tool, an electron beam 2415 thus has a very great lateral resolution capability.

Furthermore, an electron beam 2415—compared with an ion beam—has the advantage that the electrons incident on the sample 2425, for example the photolithographic mask 200, substantially cannot damage the sample 2425 or the photomask 200. However, it is also possible to use an ion beam, an atomic beam or a molecular beam (not illustrated in FIG. 24) in the apparatus 2400 for the purposes of processing the sample 2425.

The scanning particle microscope 2410 is composed of an electron beam source 2405 and a column 2420, in which is arranged the beam optical unit 2413 for instance in the form of an electron optical unit of the SEM 2410. In the SEM 2410 in FIG. 24, the electron beam source 2405 generates an electron beam 2415, which is directed as a focused electron beam 2415 onto the sample 2425, which can comprise the photolithographic mask 200, at the location 2422 by the imaging elements arranged in the column 2420, said imaging elements not being illustrated in FIG. 24. The beam optical unit 2413 thus forms the imaging system 2413 of the electron beam source 2405 of the apparatus 2400.

Further, the imaging elements of the column 2420 of the SEM 2410 can scan the electron beam 2415 over the sample 2425. The sample 2425 can be examined using the electron beam 2415 of the apparatus 2400. In general, the electron beam 2415 is incident on the sample 2425 perpendicularly.

The backscattered electrons and secondary electrons generated in an interaction region or a scattering cone of the sample 2425 by the electron beam 2415 are registered by the detector 2417. The detector 2417 that is arranged in the electron column 2420 is referred to as an "in lens detector." The detector 2417 can be installed in the column 2420 in various embodiments. The detector 2417 converts the secondary electrons generated by the electron beam 2415 at the measurement point 2422 and/or the electrons backscattered from the sample 2425 into an electrical measurement signal and transmits the latter to an evaluation unit 2480 of the apparatus 2400. The evaluation unit 2480 analyzes the measurement signals from the detectors 2417 and 2419 and generates an image of the sample 2425 therefrom, said image being displayed on the display 2495 of the evaluation unit 2480. The detector 2417 can additionally contain a filter or a filter system in order to discriminate the electrons in terms of energy and/or solid angle (not represented in FIG. 24).

The exemplary apparatus 2400 can include a second detector 2419. The second detector 2419 can be designed to detect electromagnetic radiation, in particular in the X-ray range. As a result, the detector 2419 makes it possible to analyze a material composition of the radiation generated by the sample 2425 during the examination thereof. The detectors 2417 and 2419 can be controlled by the control unit 2180 of the computer system 2330. In an alternative embodiment, the apparatus 2400 comprises a dedicated control unit (not illustrated in FIG. 24).

Further, the apparatus 2400 can comprise a third detector (not illustrated in FIG. 24). The third detector can be embodied in the form of an Everhart-Thornley detector and is typically arranged outside the column 2420. In general, it is used to detect secondary electrons.

The apparatus 2400 can comprise an ion source that provides ions with low kinetic energy in the region of the sample 2425 (not represented in FIG. 24). The ions with low kinetic energy can compensate for charging of the sample 2425.

The sample 2425 is arranged on a sample stage 2430 or a sample holder 2430 for examination purposes. A sample stage 2430 is also known as a "stage" in the art. As symbolized by the arrows in FIG. 24, the sample stage 2430 can be moved in three spatial directions relative to the column 2415 of the SEM 2410, for example by way of micro-manipulators that are not illustrated in FIG. 24.

Besides the translational movement, the sample stage 2430 can be rotated at least about an axis oriented parallel to the beam direction of the particle beam source 2405. It is furthermore possible for the sample stage 2430 to be embodied such that it is rotatable about one or two further axes, this axis or these axes being arranged in the plane of the sample stage 2430. The two or three axes of rotation preferably form a rectangular coordinate system.

The sample 2425 to be examined can be any arbitrary microstructured component or device that requires analysis and, if appropriate, subsequent processing, for example the repair of a local defect 240 of a pattern element 220 of a photolithographic mask 200.

Further, the apparatus 2400 in FIG. 24 can comprise one or more scanning probe microscopes, for example in the form of an atomic force microscope (AFM) (not shown in FIG. 24), which can be used to analyze and/or process the sample 2425.

The scanning electron microscope 2410 illustrated by way of example in FIG. 24 is operated in a vacuum chamber 2470. In order to generate and maintain a reduced pressure required in the vacuum chamber 2470, the SEM 2410 in FIG. 24 has a pump system 2472.

The gas providing system 2390 realized by the apparatus 2400 is discussed below. As already explained above, the sample 2425 is arranged on a sample stage 2430. The imaging elements of the column 2420 of the SEM 2410 can focus the electron beam 2415 and scan the latter over the sample 2525. The electron beam 2415 of the SEM 2410 can be used to induce a particle beam-induced deposition process (EBID, electron beam induced deposition) and/or a particle beam-induced etching process (EBIE, electron beam induced etching). The exemplary apparatus 2400 in FIG. 24 has three different supply containers 2440, 2450 and 2460, for storing various precursor gases, for the purposes of carrying out these processes.

The first supply container 2440 stores a precursor gas, for example a metal carbonyl, for instance chromium hexacarbonyl ($Cr(CO)_6$), or a main group metal alkoxide, such as TEOS, for instance. With the aid of the precursor gas stored in the first supply container 2440, material missing from the photolithographic mask 200 can be deposited thereon within the scope of a local chemical deposition reaction, for example. Missing material of a mask 200 can comprise missing absorber material, for example chromium, missing substrate material 210, for instance quartz, missing material of an OMOG mask, for instance molybdenum silicide, or missing material of a multilayer structure of a reflective photomask, for instance molybdenum and/or silicon.

The electron beam 2415 of the SEM 2410 acts as an energy supplier for splitting the precursor gas, which is stored in the first supply container 2440, at the site where material is intended to be deposited on the sample 2425. This means that the combined provision of an electron beam 2415 and a precursor gas leads to an EBID process being carried out for local deposition of missing material, for example material missing from the photomask 200. The modified SEM 2410 of the apparatus 2400 in combination with the precursor gas stored in the first supply container 2440 can comprise an apparatus for producing a repair element 410, 510, 610 on a photolithographic mask.

As already explained above, an electron beam 2415 can be focused to a spot diameter in the range of a few nanometers. The interaction region or the scattering cone in which an electron beam 2415 generates secondary electrons depends firstly on the energy of the electron beam 2415 and secondly on the material composition on which the electron beam 2415 impinges. The diameters of interaction regions attain values in the low single-digit nanometer range. The diameter of a scattering cone of an electron beam 2415 thus limits the achievable resolution limit during the generation of a repair element 410, 510, 610 by implementing the corresponding repair shape. Said resolution limit at the present time is in the single-digit nanometer range.

In the apparatus 2400 illustrated in FIG. 24, the second supply container 2450 stores an etching gas, which allows a local electron beam-induced etching (EBIE) process to be carried out. With the aid of an electron beam-induced etching process, excess material can be removed from the sample 2425, for instance the excess material of the pattern element 860 can be removed from the photolithographic mask 800. By way of example, an etching gas can comprise xenon difluoride ($XeF_2$), a halogen or nitrosyl chloride (NOCl). The particle beam source 2350 in combination with the gas providing system 2390 thus forms an apparatus 2400 for producing a repair element 410, 510, 610.

An additive or additional gas can be stored in the third supply container 2460, said gas, where necessary, being able to be added to the etching gas kept available in the second supply container 2450 or to the precursor gas stored in the first supply container 2440. Alternatively, the third supply container 2460 can store a second precursor gas or a second etching gas.

In the apparatus 2400 illustrated in FIG. 24, each of the supply containers 2440, 2450 and 2460 has its own control valve 2442, 2452 and 2462 in order to monitor or control the amount of the corresponding gas that is provided per unit time, i.e., the gas volumetric flow at the site 2422 of the incidence of the electron beam 2415 on the sample 2425. The control valves 2442, 2452 and 2462 can be controlled and supervised by the control unit 2180 of the computer system 2330. It is thus possible to set the partial pressure ratios of the gas or gases provided at the processing location 2422 for carrying out an EBID and/or EBIE process in a wide range.

Furthermore, in the exemplary apparatus 2400 in FIG. 24, each supply container 2440, 2450 and 2460 has its own gas feedline system 2445, 2455 and 2465, which ends with a nozzle 2447, 2457 and 2467 in the vicinity of the point of incidence 2422 of the electron beam 2415 on the sample 2425.

The supply containers 2440, 2450 and 2460 can have their own temperature setting element and/or control element, which allows both cooling and heating of the corresponding supply containers 2440, 2450 and 2460. This makes it possible to store and in particular provide the precursor gas at the respectively optimum temperature (not shown in FIG. 24). The control unit 2180 can control the temperature setting elements and the temperature control elements of the supply containers 2440, 2450, 2460. During the EBID and the EBIE processing processes, the temperature setting elements of the supply containers 2440, 2450 and 2460 can further be used to set the vapor pressure of the precursor gases stored therein by way of the selection of an appropriate temperature.

The apparatus 2400 can comprise more than one supply container 2440 in order to store two or more precursor gases. Further, the apparatus 2400 can comprise more than one supply container 2450 in order to store two or more etching gases (not shown in FIG. 24).

What is claimed is:

1. A method for repairing at least one defect of a lithographic mask, the method comprising the step of:

ascertaining parameters of at least one repair shape for the at least one defect, wherein ascertaining parameters comprises: allocating at least one numerical value to a parameter, wherein the numerical value deviates from the numerical value predefined by the at least one defect for said parameter, wherein the deviation of the numerical value of the at least one parameter is selected from a range whose lower limit is greater than zero and less than a resolution limit of the lithographic mask, and recording at least one aerial image of the at least one defect.

2. The method according to claim 1, wherein the at least one parameter comprises at least one element from the group: at least one lateral dimensional size of the at least one repair shape, a height dimensional size of the at least one repair shape, a distance between the at least one repair shape and the at least one defect, a material composition of the at least one defect, a geometric shape of the at least one repair shape, and surroundings of the at least one defect on the lithographic mask.

3. The method according to claim 1, wherein the at least one parameter deviates by a predetermined absolute value from the numerical value predefined by the at least one defect for said parameter.

4. The method according to claim 1, wherein the resolution limit of the lithographic mask is determined by an actinic wavelength of the lithographic mask, a numerical aperture, and an exposure setting suitable for projecting a pattern of the lithographic mask into a photoresist arranged on a wafer.

5. The method of claim 4, wherein the numerical aperture comprises a numerical aperture of a projection lens of an exposure system suitable for projecting the pattern of the lithographic mask into the photoresist.

6. The method according to claim 1, wherein the resolution limit of the lithographic mask comprises a mask-side resolution limit of an exposure system suitable for exposing a wafer using the lithographic mask.

7. The method according to claim 6, wherein the mask-side resolution limit is determined by $$R_M = \frac{0.5 \cdot \lambda}{NA_M \cdot (1 + \sigma)},$$

and wherein $\lambda$ is the actinic wavelength of the lithographic mask, $NA_M$ is the mask-side numerical aperture of the projection lens of the exposure system, and $\sigma$ is an exposure setting of the exposure system suitable for exposing the lithographic mask.

8. The method according to claim 1, wherein the deviation of the numerical value of the at least one corresponding parameter comprises a range of 2% to 80% of a resolution limit of the lithographic mask.

9. The method according to claim 1, wherein a dimensional size of at least one dimension of the at least one repair shape comprises a range of 10% to 90% of a dimensional size of the corresponding dimension of the at least one defect.

10. The method according to claim 1, wherein the at least one defect comprises at least one element from the group: an edge placement error of a pattern element, at least one of an interrupted connection of a pattern element and a bridged connection of a pattern element, an outlier of an edge roughness of a pattern element, a particle adhering on the lithographic mask, a lateral defect having only low printability, a defect residue of a defect repair carried out, a sidewall angle error of a pattern element, and at least one of a center of gravity error of a pattern element and of a distance range between two pattern elements.

11. The method according to claim 1, wherein recording the at least one aerial image of the at least one defect comprises at least one of: measuring the at least one aerial image, simulating the at least one aerial image or calculating the at least one image.

12. The method according to claim 11, wherein recording the at least one aerial image comprises at least one of: recording the at least one aerial image of the at least one defect at an actinic wavelength of the lithographic mask and recording an aerial image focus stack of the at least one defect.

13. The method according to claim 1, wherein allocating the numerical value comprises: applying a trained machine learning model for determining the deviation of the numerical value of the at least one parameter from the numerical value predefined by the at least one defect for said parameter.

14. The method according to claim 1, wherein ascertaining the parameters of the at least one repair shape comprises: applying a trained machine learning model for ascertaining the parameters of the at least one repair shape.

15. The method according to claim 1, furthermore comprising the step of: producing at least one repair element on the lithographic mask by use of the ascertained repair shape.

16. The method according to claim 15, wherein producing the at least one repair element comprises at least one of: carrying out at least one local etching process and carrying out at least one local deposition process by use of at least one focused particle beam and at least one precursor gas.

17. The method according to claim 1, comprising the steps of:
   a. producing at least one repair element by use of at least one repair shape for which the parameters are defined by the at least one defect; and
   b. ascertaining parameters of a repair shape for a remaining defect residue, wherein ascertaining parameters for the repair shape for the remaining defect residue comprises: allocating at least one numerical value to a parameter which deviates from the numerical value predefined by the remaining defect residue for said parameter.

18. A method for repairing at least one defective pattern element of a lithographic mask, the method comprising the steps of:
   a. determining at least one repair element of the lithographic mask which does not image the lithographic mask during the exposure thereof, wherein the at least one repair element is configured to change an imaging behavior of the at least one defective pattern element, and wherein determining the at least one repair element comprises recording at least one aerial image of the at least one defective pattern element; and
   b. producing the at least one repair element on the lithographic mask by use of at least one focused particle beam and at least one precursor gas.

19. The method according to claim 18, wherein the at least one repair element has at least one-dimensional size which comprises a range of 10% to 90% of a resolution limit of the lithographic mask.

20. The method according to claim 18, wherein a distance between the at least one repair element and the at least one defective pattern element comprises a range of 2% to 80% of a resolution limit of the lithographic mask.

21. A computer program stored in a non-volatile memory comprising instructions which, when the latter are executed by a computer system, cause the computer system to carry out the method step of claim 1.

22. An apparatus for repairing at least one of a lithographic mask, comprising: means for ascertaining parameters of at least one repair shape for the at least one defect, wherein the means for ascertaining parameters comprises: means for allocating a numerical value to at least one parameter which deviates from the numerical value predefined by the at least one defect for said parameter, and wherein the deviation of the numerical value of the at least one parameter is selected from a range whose lower limit is greater than zero and less than a resolution limit of the lithographic mask; and means for recording at least one aerial image of the at least one defect.

23. An apparatus for repairing at least one defective pattern element of a lithographic mask, comprising:
    a. means for recording at least one aerial image of the at least one defective pattern element;
    b. means for determining at least one repair element of the lithographic mask using the at least one aerial image which does not image the lithographic mask during the exposure thereof, wherein the at least one repair element is configured to change an imaging behavior of the at least one defective pattern element; and
    c. means for providing a focused particle beam and at least one precursor gas which are configured to produce the at least one repair element on the lithographic mask.

24. A lithographic mask repaired according to the method step of claim 1 to be used in an exposure system.

25. An exposure system using a lithographic mask repaired according to the method step of claim 1.

26. The exposure system according to claim 25, wherein a resolution limit of the exposure system is determined by:

a wavelength of a light source of the exposure system, a numerical aperture of a projection lens of the exposure system, and an exposure setting of the exposure system.

27. The exposure system of claim 26, wherein the resolution limit comprises a wafer-side resolution limit of the projection lens.

28. The exposure system of claim 27, wherein the wafer-side resolution limit is determined by $$R_W = \frac{0.5 \cdot \lambda}{NA_W \cdot (1 + \sigma)},$$

and wherein $\lambda$ is the actinic wavelength of the lithographic mask, $NA_W$ is the wafer-side numerical aperture of the projection lens of the exposure system, and $\sigma$ is an exposure setting of the exposure system suitable for exposing the lithographic mask for projecting a pattern of the lithographic mask in a photoresist arranged on a wafer.

* * * * *